United States Patent
Kono et al.

(10) Patent No.: US 6,262,931 B1
(45) Date of Patent: Jul. 17, 2001

(54) SEMICONDUCTOR MEMORY DEVICE HAVING VOLTAGE DOWN CONVERTOR REDUCING CURRENT CONSUMPTION

(75) Inventors: Takashi Kono; Kiyohiro Furutani; Takeshi Hamamoto; Katsuyoshi Mitsui, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/539,893

(22) Filed: Mar. 31, 2000

(30) Foreign Application Priority Data

Aug. 31, 1999 (JP) ................................................ 11-245053

(51) Int. Cl.$^7$ ...................................................... G11C 8/00
(52) U.S. Cl. ...................................... 365/230.03; 365/233
(58) Field of Search ............................... 365/233, 230.03, 365/226, 189.07

(56) References Cited

U.S. PATENT DOCUMENTS 5,249,155  9/1993  Arimoto et al. .
5,798,976 * 8/1998  Arimoto ................................ 365/222
6,091,648 * 7/2000  Furutani ......................... 365/189.09

FOREIGN PATENT DOCUMENTS 62-5422   1/1987   (JP) .

\* cited by examiner

*Primary Examiner*—A. Zarabian
(74) *Attorney, Agent, or Firm*—McDermott, Will & Emery

(57) ABSTRACT

A control circuit & mode register outputs a signal responsive to each command to a VDC control circuit. The VDC control circuit outputs a signal PWRUP changing the quantity of a through current Ic of a comparator stored in a VDC in response to the command. The VDC control circuit internally generates a signal of which pulse width corresponds to a prescribed delay time, in response to input of the command. Therefore, activation of each bank may not be monitored but current consumption can be reduced by preferably controlling a power supply current while minimizing the number of delay circuits and wires.

13 Claims, 23 Drawing Sheets

SEMICONDUCTOR MEMORY DEVICE HAVING VOLTAGE DOWN CONVERTOR REDUCING CURRENT CONSUMPTION

BACKGROUND OF THE INVENTION

1. Field of the Invention

The present invention relates to a semiconductor memory device, and more specifically, it relates to a semiconductor memory device including a power supply voltage generation circuit shared by banks.

2. Description of the Background Art

An external power supply potential ext.Vdd supplied to a semiconductor chip is increasingly reduced in response to requirement for low power consumption in a system using the semiconductor chip, for example. In practice, however, it is problematic to employ the reduced external power supply potential ext.Vdd as an operating power supply potential for a transistor provided in the semiconductor chip as such, in consideration of reliability. Therefore, an internal power supply potential Vdd lower than the external power supply potential ext.Vdd is generally generated in the chip and used as the operating power supply potential for the transistor.

FIG. 18 is a block diagram showing the structure of a synchronous dynamic random access memory (SDRAM 501) as an exemplary conventional semiconductor chip.

Referring to FIG. 18, the SDRAM 501 includes four banks 0 to 3, having a storage capacity of 256 megabits in total, capable of operating independently of each other. The SDRAM 501 performs read/write operations in synchronization with an externally supplied clock signal CLK. In order to perform a desired operation, a command decided by a combination of control signals /RAS, /CAS and /WE is supplied. A control signal /CS instructing selection of any chip, a control signal CKE instructing whether or not to capture the clock signal CLK and the like are also properly supplied from an external device.

The SDRAM 501 further includes a power supply potential generation circuit 510 receiving and stepping down an external power supply potential ext.Vdd for outputting an internal power supply potential Vdd. The power supply potential generation circuit 510 indudes a VDC control circuit 532 receiving a row activation signal from each of row decoders & word drivers 10#0 to 10#3 provided in correspondence to memory array banks 14#0 to 14#3 respectively and outputting a signal PWRUP, a Vref generation circuit 534 generating a reference potential Vref, and a VDC (voltage down convertor) 536 receiving the reference potential Vref and stepping down the external power supply potential ext.Vdd to the same level as the reference potential Vref at a response speed responsive to the signal PWRUP for outputting the power supply potential Vdd.

FIG. 19 is an operation waveform diagram showing waveforms of external signals in a write operation of the SDRAM 501.

Referring to FIG. 19, the waveforms show operations with reference to a RAS-CAS delay time tRCD and a row precharge time tRP of three cycles and a burst length BL of 4.

At a time t1, a command ACT[0] for activating a row system of the bank 0 is input on the leading edge of the clock signal CLK. Each command is input with a bank address denoted by a bracketed numeral.

At the same time, a row address X for selecting a single word line WL is supplied as a combination of signals A0 to A12 and the bank address designating the bank 0 is supplied as a combination of signals BA0 and BA1.

On the leading edge of the clock signal CLK at a time t4 after three cycles, a command WRITE[0] for performing a write operation on the already activated word line WL is input. At the same time, a column address Y is supplied as a combination of the signals A0 to A9, and the bank address is also supplied. The command WRITE is decided by a combination of control signals ICS, /RAS, /CAS and /WE. In four cycles from the time t4 to a time t7, write data D0 to D3 are externally supplied by a combination of signals DQ0 to DQ15 and written in a memory cell.

At a time t8, a command PRE[0] for resetting the word line WL of the active bank 0 is input. The command PRE is supplied by a combination of he control signals /CS, /RAS, /CAS and /WE. After the final data D3 is written, a time tWR must be set before the command PRE[0] is input, in order to guarantee that the data are reliably written in the memory cell. Data can be written in a specific bank in the aforementioned manner.

When continuously accessing the same bank 0, a time exceeding a row precharge time tRP must be set before inputting the next command ACT[0].

A representative specification of such an SDRAM is referred to as "PC 100", and the following description is made with reference to the SDRAM 501 based on PC 100.

When performing the operations shown in FIG. 19, current consumption in the SDRAM 501 temporally changes under the internal power supply potential Vdd.

FIG. 20 is a schematic waveform diagram showing temporal change of current consumption.

Referring to FIG. 20, current consumption starting from each command input abruptly increases under the power supply potential Vdd in a single row cycle, i.e., a cycle for executing the commands ACT, WRITE and PRE. The SDRAM 501 performing a read/write operation at a high speed exhibits extremely large peak and average values of current consumption. On the other hand, the SDRAM 501 exhibits small current consumption in periods between the times t2 and t3 and between the times t4 and t5, i.e., periods Trs1 and Trs2 after completing prescribed operations and before receiving next commands. In general, the period Trs1 or Trs2 is referred to as an active standby period, which is different from the so-called standby period when no row system is activated. A current Ias consumed in the active standby state is larger than a current Iss consumed in the standby state due to activation of the row system. In order to cope with such fluctuation of current consumption under the power supply potential Vdd, the VDC (voltage down convertor) 536 generating the power supply potential Vdd must be properly controlled.

The VDC 536 shown in FIG. 18 is formed by a comparator and a driver, as described later with reference to embodiments of the present invention. The operating speed of the comparator increases in response to a through current Ic flowing therein, while this through current Ic is preferably reduced in the standby period or the active standby period. Therefore, the VDC control circuit 532 changes the signal PWRUP output therefrom in response to a current consumed in a power source for switching the value of the through current Ic.

FIG. 21 is a diagram for illustrating the structure of the VDC control circuit 532 shown in FIG. 18.

Referring to FIGS. 18 and 21, a control circuit & mode register 8 shown in FIG. 18 includes a bank address decoder 92, a command decoder 94 and a selection circuit 96. The bank address decoder 92 receives internal bank address signals int.BA0 and int.BA1 from an address buffer 2, decodes the same and outputs bank designation signals BAD0 to BAD3. Each prefix "int." indicates that the signal is obtained by latching an externally supplied signal in a high-level period of an internal clock signal CLKI.

The command decoder 94 receives control signals int.RAS, int.CAS and int.WE from a control signal input buffer 6, decodes the same and outputs a signal ACTF indicating input of an ACT command and a signal PREF indicating input of a PRE command. The signals ACTF and PREF are generated irrelevantly to bank information. The selection circuit 96 receives the bank designation signals BAD0 to BAD3 and the signals ACTF and PREF. The selection circuit 96 generates signals ACTF0 to ACTF3 activating row systems of the banks 0 to 3 and signals PCGF0 to PCGF3 inactivating the row systems of the banks 0 to 3. These signals ACTF0 to ACTF3 and PCGF0 to PCGF3 go high only by one cycle in the designated banks 0 to 3.

These signals ACTF0 to ACTF3 and PCGF0 to PCGF3 are input in latches 100#0 to 100#3 provided in correspondence to the banks 0 to 3 respectively. The latches 100#0 to 100#3 are included in the row decoders & word drivers 10#0 to 10#3 provided in an area 98 arranged in proximity to the banks 0 to 3 respectively.

For simplifying illustration, FIG. 21 shows the area 98 as a single one. In practice, however, such an area 98 is arranged in a position separated from a peripheral area provided with the selection circuit 96 etc., i.e., in proximity to each of the banks 0 to 3, and not collectively arranged.

The VDC control circuit 532 includes a four-input NAND circuit 542 receiving signals ZRASE0 to ZRASE3 held by the latches 100#0 to 100#3 respectively for indicating activation of the banks 0 to 3, a delay circuit 544 delaying and outputting an output of the NAND circuit 542, a NOR circuit 546 receiving the outputs of the NAND circuit 542 and the delay circuit 544 and an invertor 548 receiving and inverting an output of the NOR circuit 546 and outputting the signal PWRUP.

FIG. 22 is a circuit diagram showing the structure of the selection circuit 96 appealing in FIG. 21.

Referring to FIG. 22, the selection circuit 96 includes a gate circuit 552 provided in correspondence to the bank 0, a gate circuit 554 provided in correspondence to the bank 1, a gate circuit 556 provided in correspondence to the bank 2, and a gate circuit 558 provided in correspondence to the bank 3.

The gate circuit 552 includes a NAND circuit 562 receiving the bank designation signal BAD0 and the signal ACTF, an invertor 564 receiving and inverting an output of the NAND circuit 562 and outputting the signal ACTF0, an OR circuit 566 receiving the bank designation signal BAD0 and an internal address signal int.A10, a NAND circuit 568 receiving an output of the OR circuit 566 and the signal PREF, and an invertor 570 receiving and inverting an output of the NAND circuit 568 and outputting the signal PCGF0.

The gate circuit 554 receives the bank designation signal BAD1 in place of the bank designation signal BAD0 and outputs the signals ACTF1 and PCGF1 in place of the signals ACTF0 and PCGF0 in the circuit structure of the gate circuit 552. The gate circuit 556 receives the bank designation signal BAD2 in place of the bank designation signal BAD0 and outputs the signals ACTF2 and PCGF2 in place of the signals ACTF0 and PCGF0 in the circuit structure of the gate circuit 552. The gate circuit 558 receives the bank designation signal BAD3 in place of the bank designation signal BAD0 and outputs the signals ACTF3 and PCGF3 in place of the signals ACTF0 and PCGF0 in the circuit structure of the gate circuit 552. Therefore, description of these gate circuits 554, 556 and 558 is not particularly repeated.

The row systems of all banks 0 to 3 are reset when the address signal A10 is high in a PRE command on the specification of the SDRAM 501, and hence the signals PCGF0 to PCGF3 for resetting the row systems of the banks 0 to 3 simultaneously go high when the signal int.A10 goes high in the selection circuit 96.

Referring again to FIG. 21, the signals ACTF0 to ACTF3 and PCGF0 to PCGF3 having bank information are transmitted to the corresponding banks 0 to 3 and input in the latches 100#0 to 100#3. When the signals ACTF0 to ACTF3 go high, the latches 100#0 to 100#3 set the signals ZRASE0 to ZRASE3 indicating activation of the row systems low. The signals ZRASE0 to ZRASE3 go low when the row systems are activated. The latches 100#0 to 100#3 are reset when the signals PCGF0 to PCGF3 go high. In other words, the signals ZRASE0 to ZRASE3 go high at this time.

The VDC 536 shown in FIG. 18 increases the through current Ic in the internal comparator when the row system is activated in any of the banks 0 to 3 to cope with increase of current consumption, and hence the signal PWRUP instructing this operation is activated when any of the signals ZRASE0 to ZRASE3 is low. As shown in FIG. 21, generation of the signal PWRUP can be implemented by NANDing the signals ZRASE0 to ZRASE3 indicating activation of the four banks 0 to 3. The delay stage for delaying fall of the signal PWRUP from a high level to a low level is provided in order to compensate for increase of current consumption when the row systems are reset. When a PRE command is received, the latches 100#0 to 100#3 shown in FIG. 21 are reset and the signals ZRASE0 to ZRASE3 indicating activation of the banks 0 to 3 return to high levels. Therefore, the delay stage is provided for compensating for a power supply current consumed when the row systems are reset between the times t5 to tG shown in FIG. 20.

FIG. 23 is a waveform diagram for illustrating the signal PWRUP. Referring to FIGS. 21 and 23, the signal ZRASE0 for the bank 0 goes low when the command ACT[0] is input at the time t1, and hence the signal PWRUP responsively goes high. The signal PWRUP remains high up to the time t5 when the command PRE[0] input. When the command PRE[0] is input at the time t5, the latch 100#0 is responsively reset and the signal ZRASE0 goes high. Then, the signal PWRUP falls to a low level at the time t6 after a lapse of a delay time Td11 of the delay circuit 544.

FIG. 24 is a waveform diagram for studying a waveform of the signal PWRUP for controlling the through current Ic of the comparator with more fidelity to increase/decrease of current consumption.

Referring to FIG. 24, consumption of the power supply current peaks for a constant time after input of a command, and thereafter enters an active standby state or a standby state. Therefore, there may be provided a circuit setting the signal PWRUP high for a delay time Td21 corresponding to the times t1 to t2 when the command ACT[0] is input, keeping the same high for a delay time Td22 corresponding to the times t3 to t4 when the command WRITE[0] is input and keeping the same high for a delay time Td23 corresponding to the times t5 to t6 when the command PRE[0] is input.

In order to simplify the description, study is made only on a part setting the signal PWRUP high for a constant period starting from an ACT command. It is to be noted that a multi-bank structure is allowed to activate a plurality of banks one after another and the signal PWRUP must necessarily be high during a row-system activation period of any activated bank.

FIG. 25 is a circuit diagram showing the structure of a circuit 590 controlling activation of the signal PWRUP corresponding to the ACT command.

Referring to FIG. 25, the circuit 590 includes a pulse generation circuit 592 outputting a pulse signal REP0 of a constant width in response to activation of the signal ZRASE0 shown in FIG. 21, a pulse generation circuit 594 outputting a pulse signal REP1 in response to activation of the signal ZRASE1, a pulse generation circuit 596 outputting a pulse signal REP2 in response to activation of the signal ZRASE2, a pulse generation circuit 598 generating a pulse signal REP3 in response to activation of the signal ZRASE3, a four-input NOR circuit 600 receiving the pulse signals REP0 to REP3 and an invertor 602 receiving and inverting an output of the NOR circuit 600. The invertor 602 outputs the signal PWRUP.

The pulse generation circuit 592 includes a delay circuit 604 receiving the signal ZRASE0 and delaying the same by the delay time Td21, an invertor 606 receiving and inverting an output of the delay circuit 604, and a NOR circuit 608 receiving the signal ZRASE0 and an output of the invertor 606 and outputting the pulse signal REP0.

The pulse generation circuits 594 to 598 receive the signals ZRASE1 to ZRASE3 in inputs thereof and output the signals REP1 to REP3 respectively. These pulse generation circuits 594 to 598 are similar in structure to the pulse generation circuit 592, and hence redundant description is not repeated.

FIG. 26 is an operation waveform diagram showing waveforms appearing when commands ACT[0] to ACT[3] are continuously input in the circuit 590 shown in FIG. 25.

When the command ACT[0] is input at a time t1, the signal ZRASE0 indicating activation of the bank 0 is activated low. The pulse generation circuit 592 responsively sets the pulse signal REP0 high for the delay time Td21. The delay time Td21 is set to correspond to a current increase period by the ACT command shown in FIG. 24. Similarly, the commands ACT[1], ACT[2] and ACT[3] are input at times t2, t3 and t4 respectively for activating the pulse signals REP1 to REP3 for the delay time Td21 respectively. The signal PWRUP has a continuous waveform due to such a circuit structure. In other words, the voltage down convertor (VDC) 536 can cope with increase of current consumption following continuous activation of a plurality of banks.

While the above description is made with reference to extremely simplified control of the through current Ic, the through current Ic can be more strictly controlled with a plurality of control signals.

When commands are temporally discretely supplied for a plurality of banks, a time lag results in change of the current consumed in each bank. It is important in control of a voltage down convertor (VDC) shared by banks in a multi-bank structure that the voltage down convertor can cope with this time lag with a sufficient response speed and sufficient drivability.

In the exemplary circuits shown in FIGS. 21 and 25, the signals including bank information or the derivative signals generated on the basis thereof are unified to decide the period for activating the signal PWRUP high. If the number of banks is increased, however, the number of signals for generating the signal PWRUP is extremely increased.

In the circuit structure shown in FIG. 21, the signals ZRASE0 to ZRASE3 are generated in portions close to the respective banks 0 to 3 and hence these signals ZRASE0 to ZRASE3 must be temporarily collected in order to generate the signal PWRUP.

As described above, the selection circuit 96 is generally arranged on a space between the banks 0 to 3 where peripheral circuits are arranged. The VDC control circuit 532 is arranged in proximity to the voltage down convertor 536 in a space between the banks 0 to 3 similarly to the selection circuit 96. The latches 100#0 to 100#3 arranged in proximity to the banks 0 to 3 are located on positions separate from the VDC control circuit 532. In other words, long wires must be provided between the latches 100#0 to 100#3 and the VDC control circuit 532.

These wires must be provided on wiring areas of narrow spaces between the banks 0 to 3 over long distances, disadvantageously resulting in increase of the chip area. While the VDC control circuit 532 may have latches identical to those provided for the banks 0 to 3, the circuit scale is disadvantageously increased if the number of banks is increased. In the circuit structure shown in FIG. 25, delay stages must be provided for the signals ZRASE0 to ZRASE3 respectively, to disadvantageously complicate the circuit structure and also result in increase of the layout area. Thus, when the voltage down convertor (VDC) 536 shared by the banks 0 to 3 is controlled with the signals including bank information, waste of circuits and wires is increased as the number of banks is increased.

SUMMARY OF THE INVENTION

An object of the present invention is to provide a semiconductor memory device optimizing current consumption in a voltage down convertor for suppressing current consumption as a whole to be capable of coping with fluctuation of a consumed power supply current depending on an externally received command in a simple structure in relation to control of the voltage down convertor shared by banks in a multi-bank structure.

Briefly stated, the present invention is directed to a semiconductor memory device comprising a command receiving circuit, an address receiving circuit and first and second internal circuits.

The command receiving circuit outputs a command responsive to a supplied signal. The address receiving circuit outputs a row address, a column address and a bank address responsive to a supplied signal. The first internal circuit operates in response to the command, the row address, the column address and the bank address. The first internal circuit includes a plurality of banks, each having memory cells arranged in rows and columns, activated in response to the command and the bank address, a plurality of row-system circuits each provided in correspondence to each bank for performing an operation related to selection of a row of the memory cells in response to the command and the row address, and a plurality of column-system circuits each provided in correspondence to each bank for performing an operation related to selection of a column of the memory cells in response to the command and the column address. The second internal circuit operates in response to the command. The second internal circuit includes a power supply circuit supplying an operating power supply potential to the first internal circuit. The power supply circuit includes a reference potential generation circuit generating a reference potential defining a target value of the operating power supply potential, a response speed control circuit selecting an activation time and a response speed corresponding to the command, and a voltage down convertor operating in response to an output of the response speed control circuit for stepping down an external power supply potential to the level of the reference potential and outputting the operating power supply potential.

Accordingly, a principal advantage of the present invention resides in that power consumption of the voltage down convertor can be reduced by controlling the response speed of the voltage down convertor to a necessary level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
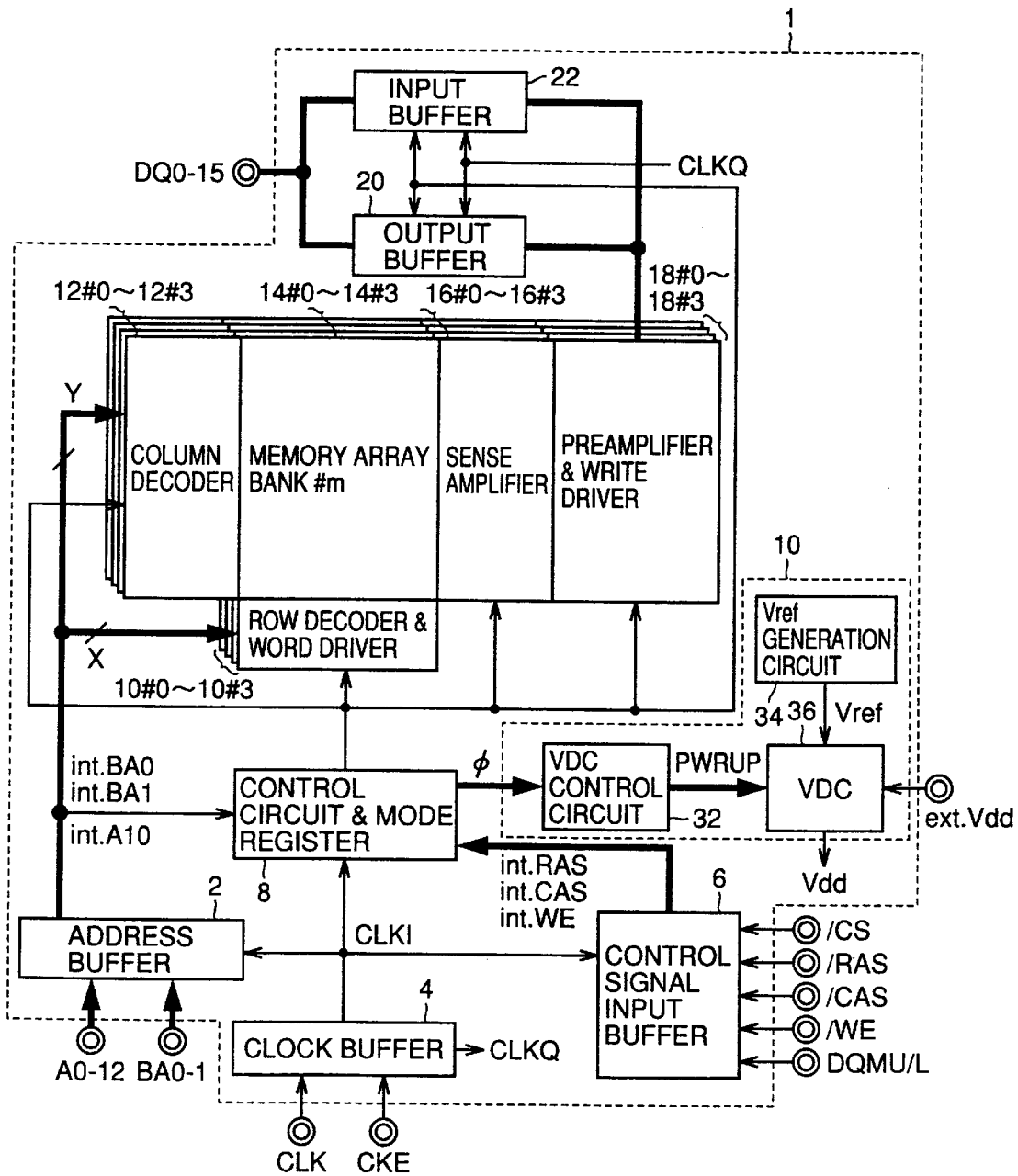
FIG. 1 is a schematic block diagram showing the structure of a semiconductor memory device 1 according to a first embodiment of the present invention.

Embodiments of the present invention are now described in detail with reference to the drawings. In the drawings, identical numerals denote the same or corresponding parts.

While the following description is made with reference to a voltage down convertor in an SDRAM having a four-bank structure, the present invention is also applicable to a semiconductor memory device having banks in a number other than four.

[First Embodiment]

FIG. 1 is a schematic block diagram showing the structure of a semiconductor memory device 1 according to a first embodiment of the present invention.

Referring to FIG. 1, the semiconductor memory device 1 includes memory array banks 14#0 to 14#3 each having a plurality of memory cells arranged in rows and columns, an address buffer 2 capturing externally supplied address signals A0 to A12 and bank address signals BA0 and BA1 in synchronization with a clock signal CLKI and outputting internal row, column and bank addresses, a clock buffer 4 externally receiving a clock signal CLK and a clock enable signal CKE and outputting clock signals CLKI and CLKQ employed in the semiconductor memory device 1, and a control signal input buffer 6 captuling externally supplied control signals /CS, /RAS, /CAS and /WE and a mask signal DQMU/L in synchronization with the clock signal CLKI.

The semiconductor memory device 1 further includes a control circuit receiving internal address signals int.A0 to int.A12 and internal bank address signals int.BA0 and int.BA1 from the address buffer 2 while receiving control signals int.RAS, int.CAS and int.WE synchronized with the clock signal CLKI from the control signal input buffer 6 and outputting control signals to respective blocks and a mode register holding an operation mode recognized in the control circuit. FIG. 1 shows the control circuit and the mode register in a single block 8. The control circuit includes a bank address decoder decoding the internal bank address signals int.BA0 and int.BA1 and a command decoder receiving and decoding the control signals int.RAS, int.CAS and int.WE.

The semiconductor memory device 1 further includes row decoders provided in correspondence to the memory array banks 14#0 to 14#3 respectively for decoding row address signals X supplied from the address buffer 2 and word drivers for driving addressed rows (word lines) in the memory array banks 14#0 to 14#3 in response to output signals from the row decoders. FIG. 1 collectively shows the row decoders and the word drivers as blocks 10#0 to 10#3.

The semiconductor memory device 1 further includes column decoders 12#0 to 12#3 decoding internal column address signals Y supplied from the address buffer 2 and generating column selection signals and sense amplifiers 16#0 to 16#3 detecting and amplifying data of memory cells connected with selected rows of the memory array banks 14#0 to 14#3.

The semiconductor memory device 1 further includes an input buffer 22 externally receiving write data and generating internal write data, write drivers amplifying the internal write data received from the input buffer 22 and transmitting the amplified internal write data to selected memory cells, preamplifiers amplifying data read from the selected memory cells, and an output buffer 20 buffering data from the preamplifiers and outputting the buffered data.

The preamplifiers and the write drivers are provided in correspondence to the memory array banks 14#0 to 14#3 respectively. FIG. 1 shows the preamplifiers and the write drivers as blocks 18#0 to 18#3. The input buffer 22 and the output buffer 20 receive the clock signal CLKQ from the clock buffer 4 and transmit/receive data to/from an external device through terminals DQ0 to DQ15 in synchronization with the clock signal CLKQ.

The semiconductor memory device 1 further includes a power supply voltage generation circuit 10 activated in response to a control signal φ received from the block 8 for stepping down an externally supplied power supply potential ext.Vdd and supplying a power supply potential Vdd to each internal block.

The power supply voltage generation circuit 10 includes a Vref generation circuit 34 generating a reference potential Vref forming the basis of the internal power supply potential Vdd, a VDC control circuit 32 outputting a control signal PWRUP in response to the control signal φ and a voltage down convertor (VDC) 36 stepping down the external power supply potential ext.Vdd to the level of the reference potential Vref and outputting the power supply potential Vdd.

Figure 2:
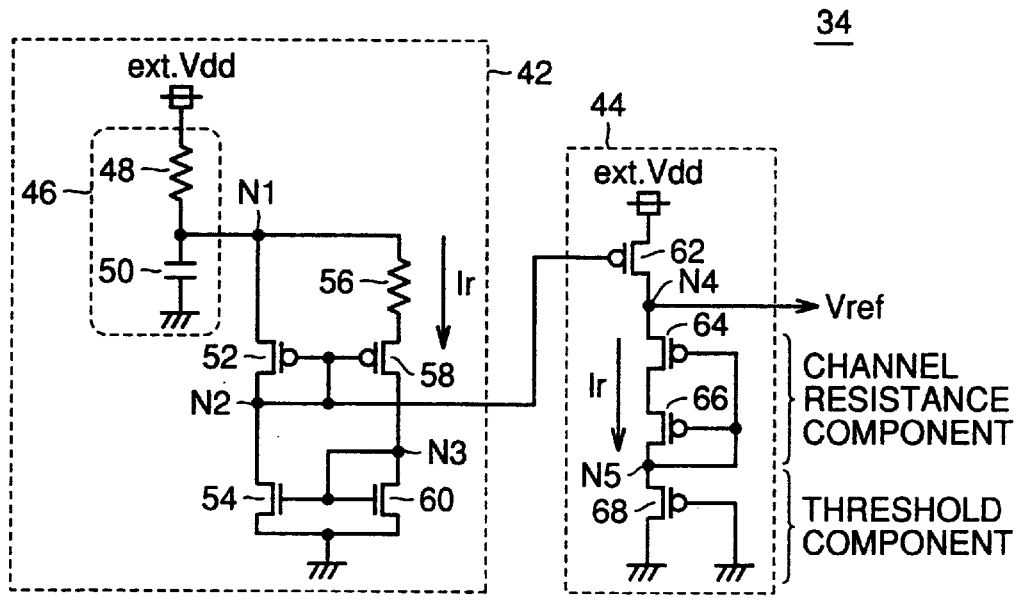
FIG. 2 is a circuit diagram showing the structure of a Vref generation circuit 34 appearing in FIG. 1.

FIG. 2 is a circuit diagram showing the structure of the Vref generation circuit 34 appearing in FIG. 1.

Referring to FIG. 2, the Vref generation circuit 34 includes a constant current source circuit 42 and a voltage output circuit 44 outputting the reference potential Vref under the control of the constant current source circuit 42.

The constant current source circuit 42 includes a low-pass filter 46 receiving the external power supply potential ext.Vdd and transmitting the same to a node N1 while removing noise, a P-channel MOS transistor 52 having a source connected to the node N1 and a gate and a drain connected to a node N2, an N-channel MOS transistor 54 connected between the node N2 and a ground node with a gate connected to a node N3, a resistor 56 and a P-channel MOS transistor 58 serially connected between the nodes N1 and N3, and an N-channel MOS transistor 60 having a drain and a gate connected to the node N3 and a source connected to the ground node. The P-channel MOS transistor 58 has a gate connected to the node N2.

The low-pass filter 46 includes a resistor 48 connected between a node supplied with the external power supply potential ext.Vdd and the node N1, and a capacitor 50 connected between the node N1 and a ground node.

The voltage output circuit 44 includes a P-channel MOS transistor 62 connected between a node supplied with the external power supply potential ext.Vdd and a node N4 with a gate connected to the node N2, P-channel MOS transistors 64 and 66 serially connected between the node N4 and a node N5 with gates connected to the node N5, and a P-channel MOS transistor 68 having a source connected to the node N5 and a gate and a drain connected to a ground node.

The node N4 outputs the reference potential Vref

Figure 3:
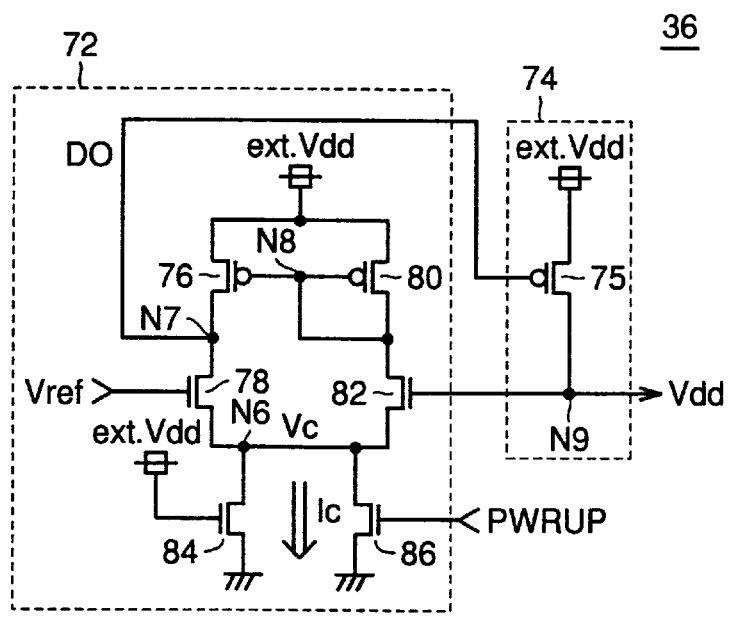
FIG. 3 is a circuit diagram showing the structure of a voltage down convertor (VDC) 36 appearing in FIG. 1.

FIG. 3 is a circuit diagram showing the structure of the voltage down convertor (VDC) 36 appearing in FIG. 1.

Referring to FIG. 3, the voltage down convertor 36 includes a comparator 72 comparing the power supply potential Vdd with the reference potential Vref and outputting a comparison result signal D0 and a driver 74 driving the power supply potential Vdd on the basis of the external power supply potential ext.Vdd in response to the comparison result signal D0.

The comparator 72 includes a P-channel MOS transistor 76 connected between a node supplied with the external power supply potential ext.Vdd and a node N7 with a gate connected to a node N8, an N-channel MOS transistor 78 connected between the node N7 and a node N6 with a gate coupled to the reference potential Vref, a P-channel MOS transistor 80 connected between the node supplied with the external power supply potential ext.Vdd and the node N8 with a gate connected to the node N8, an N-channel MOS transistor 82 connected between the nodes N8 and N6 with a gate coupled to the power supply potential Vdd, an N-channel MOS transistor 84 connected between the node N6 and a ground node with a gate coupled to the external power supply potential ext.Vdd, and an N-channel MOS transistor 86 connected between the node N6 and the ground node and receiving the signal PWRUP at its gate.

The node N7 outputs the comparison result signal D0 as the output signal from the comparator 72.

The driver 74 includes a P-channel MOS transistor 75 connected between a node supplied with the external power supply potential ext.Vdd and a node N9 and receiving the comparison result signal D0 at its gate. The node N9 outputs the power supply potential Vdd to each block of the semiconductor memory device 1.

Operations of the power supply generation circuit are now described with reference to FIGS. 2 and 3.

The constant current source circuit 42 is first described. It is assumed that W1 and W2 represent the channel widths of the P-channel MOS transistors 52 and 58 respectively. It is assumed that these transistors 52 and 58 have the same channel length. The channel widths W1 and W2 are set as W1<W2. When employing these in a subthreshold area, potential difference dV between gate-to-source potentials Vgs of the P-channel MOS transistors 52 and 58 appears across the resistor 56. The potential difference dV is expressed as follows:

$$dV = k \times T/q \times \ln(W2/W1) \qquad (1)$$

where k represents a Boltzmann factor, T represents an absolute temperature and q represents a charge quantity of electrons. The potential difference dV is given across the resistor 56 and hence a current Ir flowing through the resistor 56 can be expressed as Ir=dV/R, where R represents the resistance value of the resistor 56. Assuming that temperature dependency of the resistance value R is ignorable, the current Ir is in proportion to the absolute temperature T. In other words, the current Ir has a positive temperature characteristic.

The P-channel MOS transistor 62 in the voltage output circuit 44 has the same channel width and length as the P-channel MOS transistor 52 in the constant current source circuit 44 has and forms a current mirror circuit with the constant current source circuit 42 for correctly transferring the current Ir. The P-channel MOS transistor 64 and 66 have resistance components mainly formed by channel resistance components, and the P-channel MOS transistor 68 has a resistance component mainly decided by a threshold. These resistance components are referred to as channel resistance components and a threshold component respectively. The channel resistance components inherit the positive temperature characteristic of the current Ir. The threshold component indicates a negative temperature characteristic of a threshold voltage by employing a P-channel MOS transistor of a sufficiently large size. The temperature characteristic of the reference potential Vref can be eliminated by balancing these. It is also possible to set the reference potential Vref to exhibit a positive or negative temperature characteristic by rendering contribution of either component dominant.

The reference potential Vref generated in the Vref generation circuit 34 is fed to the voltage down convertor 36. The comparator 72 observes the power supply potential Vdd and drives the driver 74 so that the power supply potential Vdd is equal to the reference potential Vref In order to improve reaction of the comparator 72, the N-channel MOS transistors 78 and 82 must operate in a saturation region and the potential Vc of the node N6 serving as a common source of these transistors 78 and 82 must be set to a level higher than a ground potential to some extent. Therefore, the N-channel MOS transistor 84 and 86 are inserted between the node N6 and the ground node for setting the potential Vc to a proper level. The N-channel MOS transistors 84 and 86 also limit the through current Ic of the comparator 72.

When the power supply potential Vdd is supplied to peripheral circuits of an SDRAM, current consumption is extremely increased in operation of internal circuit following command input. The through current Ic of the comparator 72 may be increased so that the voltage down convertor 36 reactively copes with such current consumption. However, no large through current Ic is necessary in a standby state consuming a small current, and the through current Ic must be set small in the standby state in consideration of reduction of current consumption.

The voltage down convertor 36 shown in FIG. 3 is capable of performing the simplest control of the through current Ic. The N-channel MOS transistors 84 and 86 decide the through current Ic. It is assumed the N-channel MOS transistor 86 is larger in β ratio than the N-channel MOS transistor 84.

Figure 20:
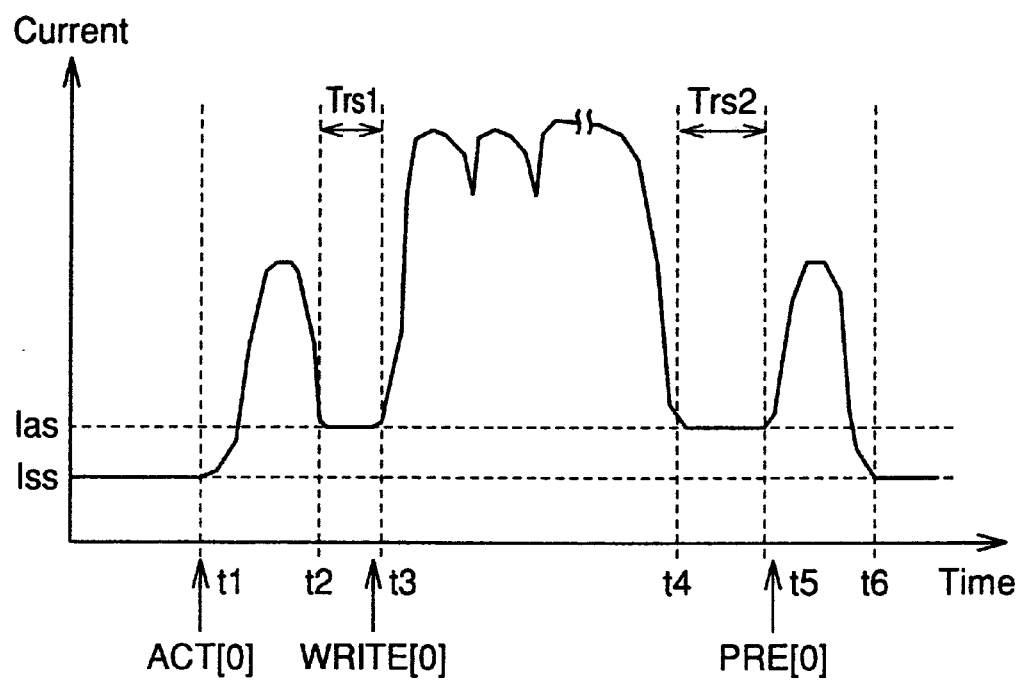
FIG. 20 is a schematic waveform diagram showing temporal change of current consumption.

When current consumption is small, the signal PWRUP is set low and the N-channel MOS transistor 86 is rendered non-conductive. Then, only the N-channel MOS transistor 84 decides the through current Ic. When consuming the current Iss shown in FIG. 20 in the standby state, for example, the size of the N-channel MOS transistor 84 can be extremely reduced.

Figure 19:
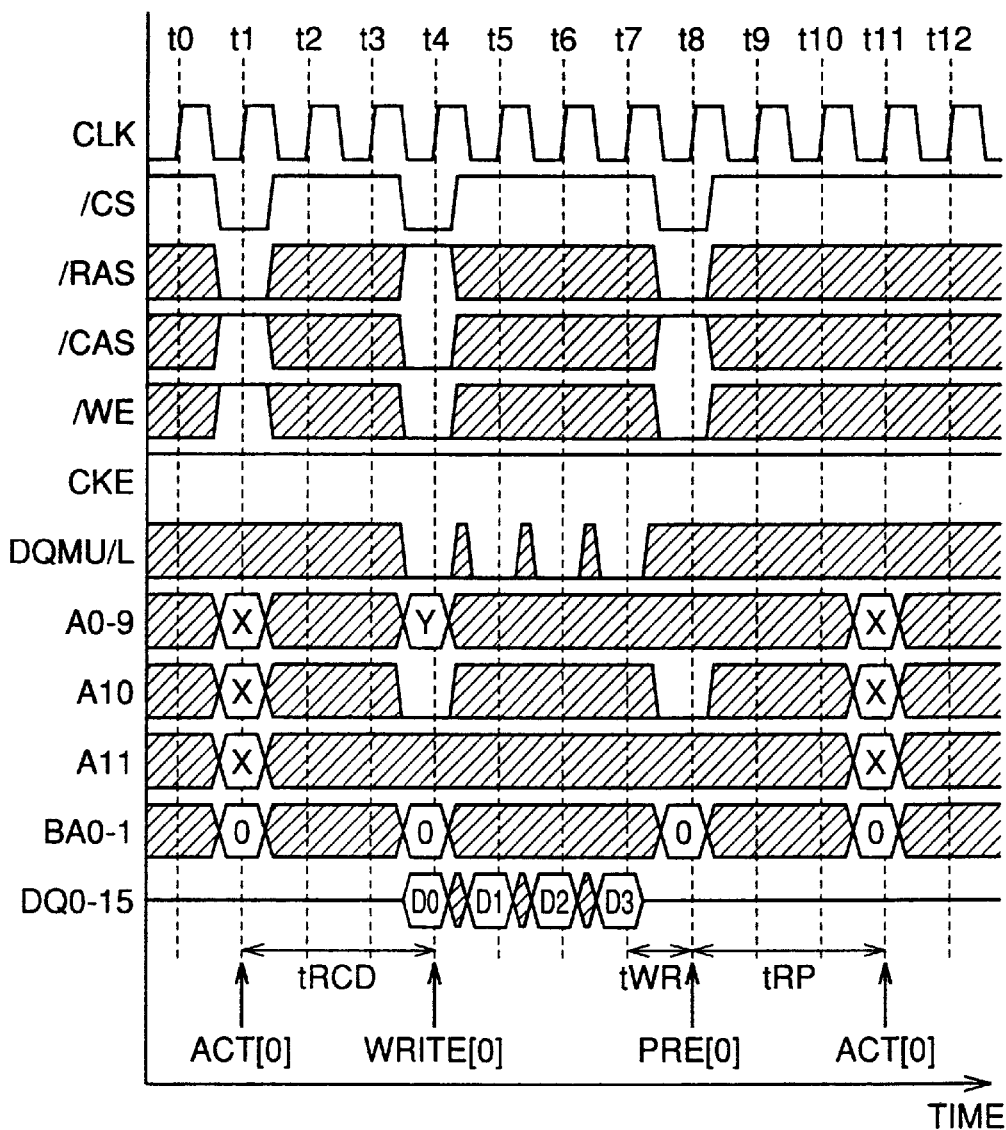
FIG. 19 is an operation waveform diagram showing waveforms of external signals in a write operation of the SDRAM 501.

In a period consuming a large current, the signal PWRUP is activated high. Then, both of the N-channel MOS transistors 84 and 86 are rendered conductive and hence the through current Ic is sufficiently increased to be capable of following abrupt change of current consumption. When the signal PWRUP is activated in a period between input of an ACT command and input of a PRE command, for example, it is possible to sufficiently cope with increase of current consumption in the operation described with reference to FIG. 19.

Alternatively, a pulse string activating the signal PWRUP for an internally decided constant period after receiving ACT, WRITE and PRE commands may be generated for more strictly controlling the through current Ic.

Considering control of a voltage down convertor shared by banks in a multi-bank structure, the voltage drop convertor must be available whichever bank is accessed to operate. In general, a command is accompanied by a bank address so that a control signal decoded by the bank address is generated in a chip. In a four-bank structure, four control signals are created for the respective banks.

Figure 4:
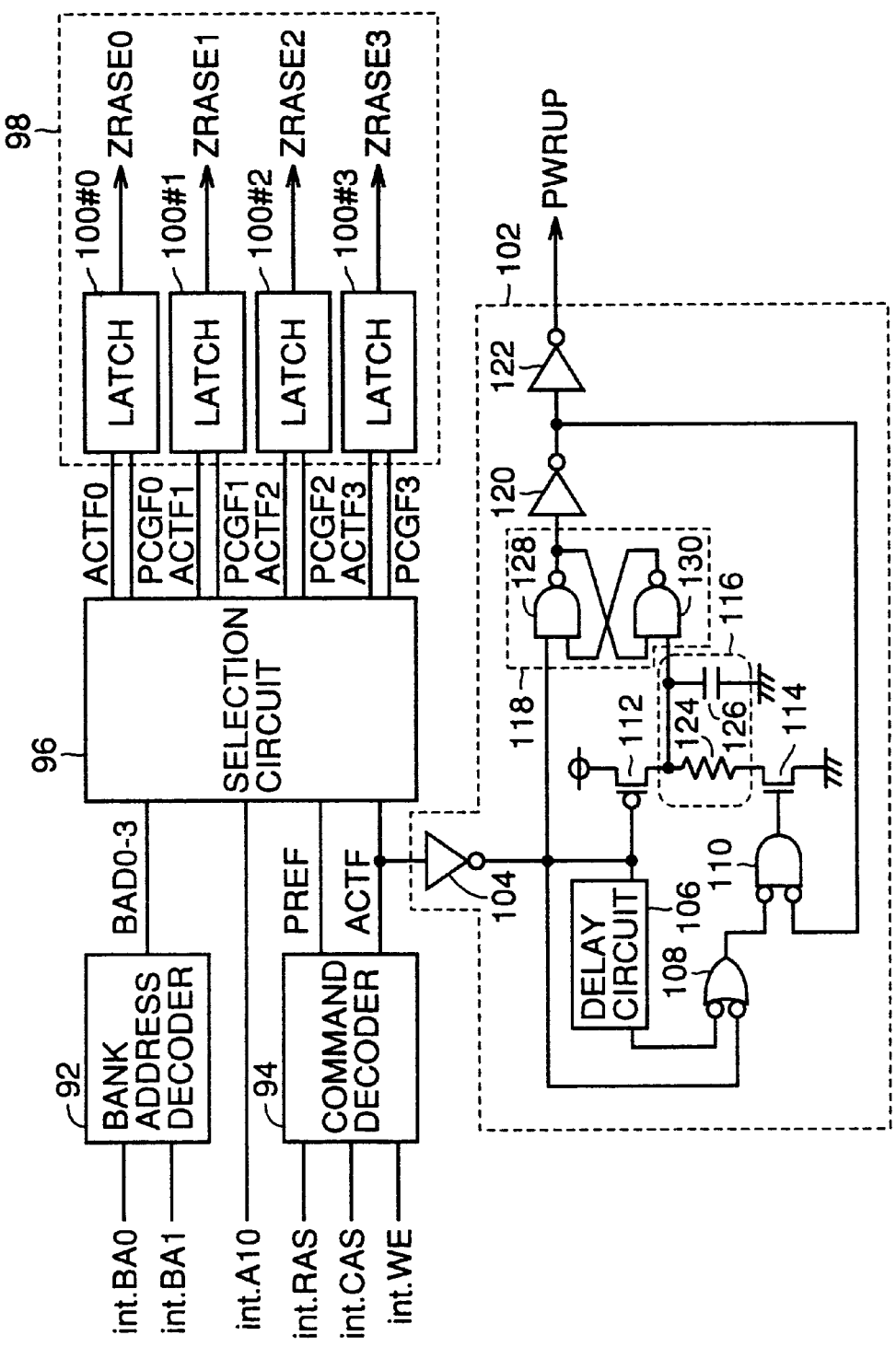
FIG. 4 is a circuit diagram for illustrating a circuit structure generating a signal PWRUP.

FIG. 4 is a circuit diagram for illustrating a circuit structure generating the signal PWRUP.

Referring to FIG. 4, the control circuit in the block 8 shown in FIG. 1 includes a bank address decoder 92 receiving the internal bank address signals int.BA0 and int.BA1 and outputting bank designation signals BAD0 to BAD3, a command decoder 94 receiving and decoding the internal control signals int.RAS, int.CAS and int.WE and outputting signals ACTF and PREF and a selection circuit 96 outputting the signals ACTF and PREF to corresponding banks 0 to 3 in accordance with the bank designation signals BAD0 to BAD3 and the internal address signal int.A10.

The selection circuit 96 outputs signals ACTF0 and PCGF0 corresponding to the bank 0 to a latch 100#0 provided in correspondence to the bank 0. When the signal ACTF0 is input, the latch 100#0 sets a signal ZRASE0 indicating activation of the bank 0 to active low. When the signal PCGF0 is input, the latch 100#0 inactivates the signal ZRASE0 high. Corresponding latches 100#1 to 100#3 are provided also for the banks 1 to 3, for performing similar operations.

It is assumed that the power supply voltage generation circuit 10 of the semiconductor memory device 1 according to the first embodiment has a plurality of voltage down convertors so that a voltage down convertor having the optimum ability is activated in every internal operation.

A VDC control circuit 102 controls the voltage down convertor 36 covering power supply current consumption following row-system activation.

The VDC control circuit 102 includes an invertor 104 receiving and inverting the signal ACTF, a delay circuit 106 delaying an output of the invertor 104, a NAND circuit 108 receiving the output of the invertor 104 and that of the delay circuit 106, and a NOR circuit 110 receiving an output of the NAND circuit 108 in a first input.

The VDC control circuit 102 further includes an RC delay circuit 116, a P-channel MOS transistor 112 activated in response to the output of the invertor 104 for charging the RC delay circuit 116, an N-channel MOS transistor 114 activated in response to the output of the NOR circuit 110 for discharging the RC delay circuit 116, a latch circuit 118 set in response to the output of the invertor 104 and reset in response to an output of the RC delay circuit 116, an invertor 120 receiving and inverting an output of the latch circuit 118 and an invertor 122 receiving and inverting an output of the invertor 120 and outputting the signal PWRUP. The output of the invertor 120 is supplied to a second input of the NOR circuit 110.

The RC delay circuit 116 includes a resistor 124 connected between drains of the P-channel MOS transistor 112 and the N-channel MOS transistor 114 and a capacitor 126 connected between the drain of the P-channel MOS transistor 112 and a ground node.

The latch circuit 118 includes a NAND circuit 128 receiving the output of the invertor 104 in a first input and a NAND circuit 130 receiving an output of the NAND circuit 128 and the potential of the drain of the P-channel MOS transistor 112. An output of the NAND circuit 130 is supplied to a second input of the NAND circuit 128. The output of the NAND circuit 128 is supplied to an input node of the invertor 120 as an output signal of the latch circuit 118.

Figure 21:
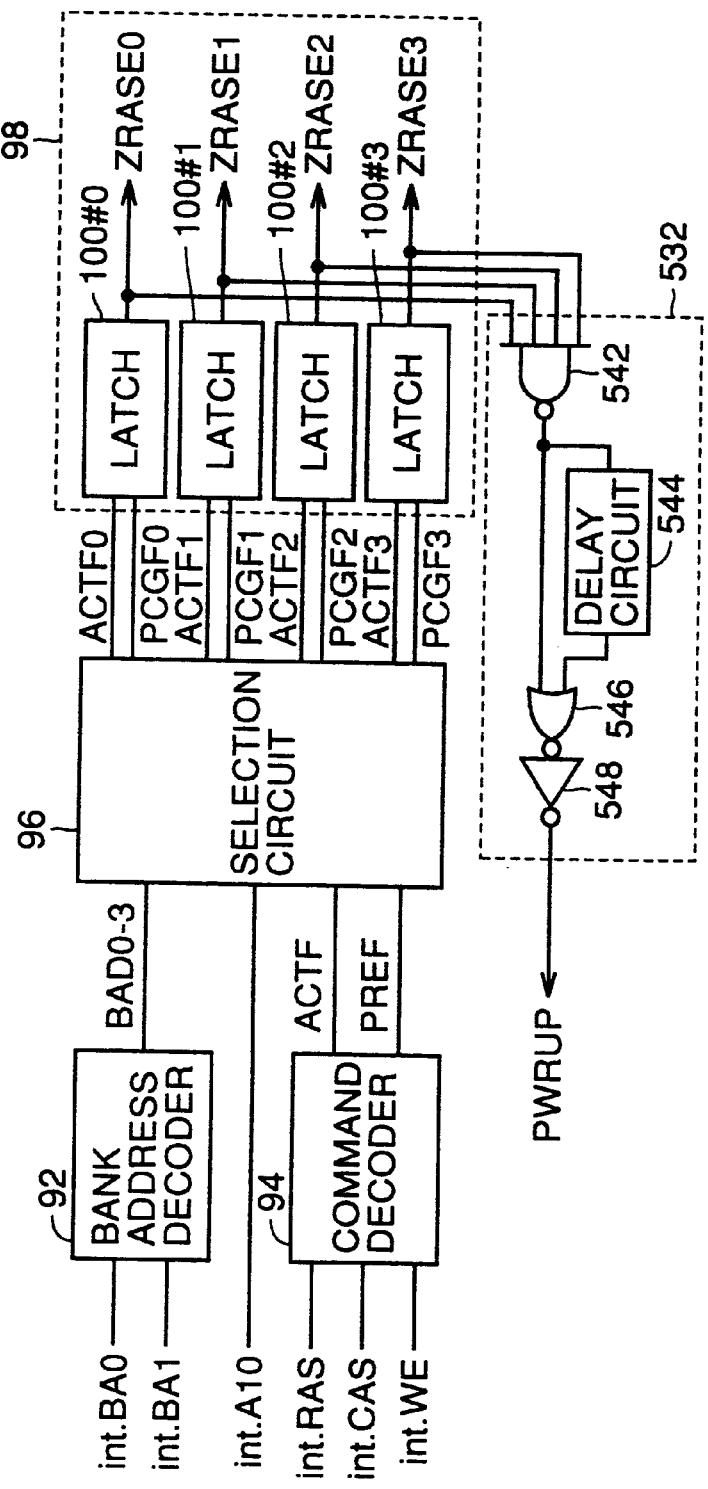
FIG. 21 is a diagram for illustrating the structure of a VDC control circuit 532 appearing in FIG. 18.
Figure 22:
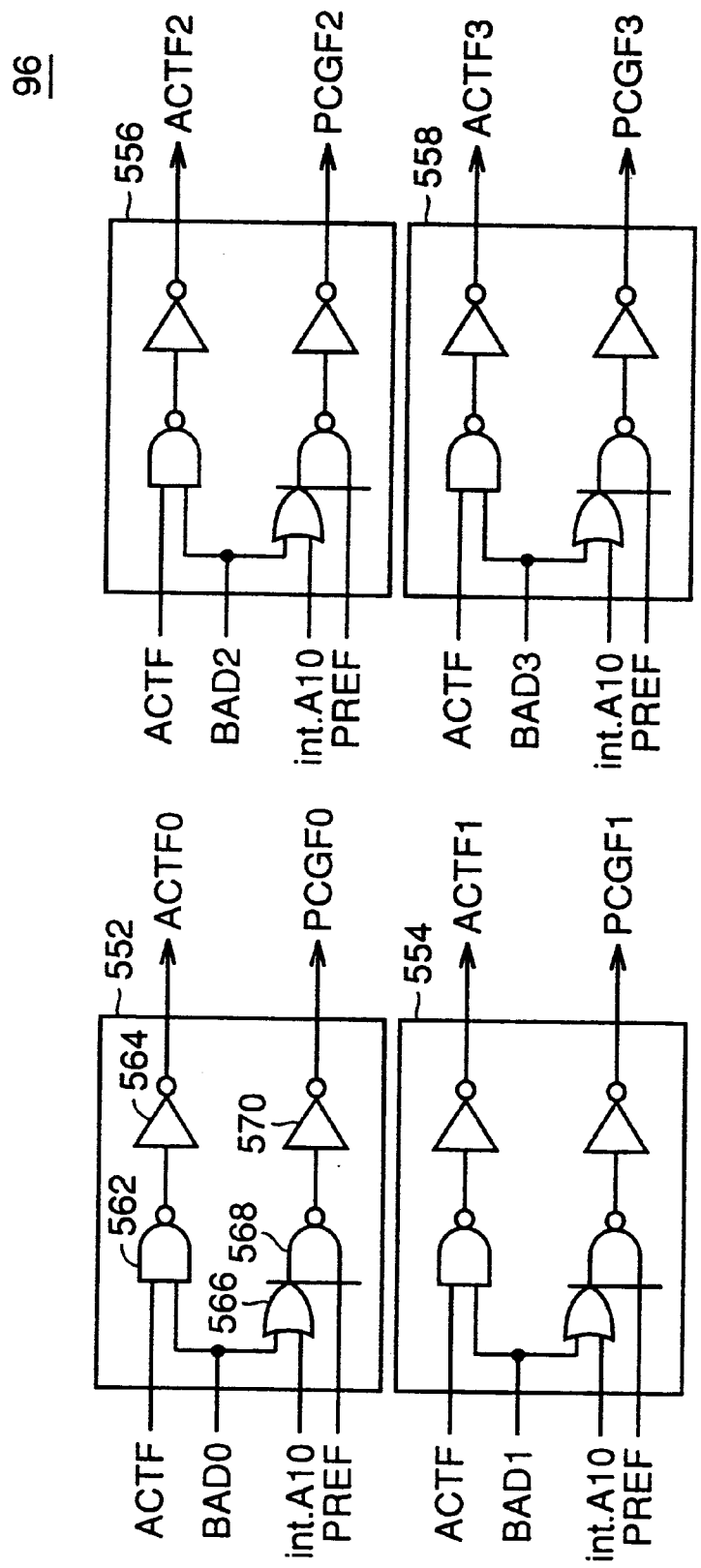
FIG. 22 is a circuit diagram showing the structure of a selection circuit 96 appearing in FIG. 21.
Figure 23:
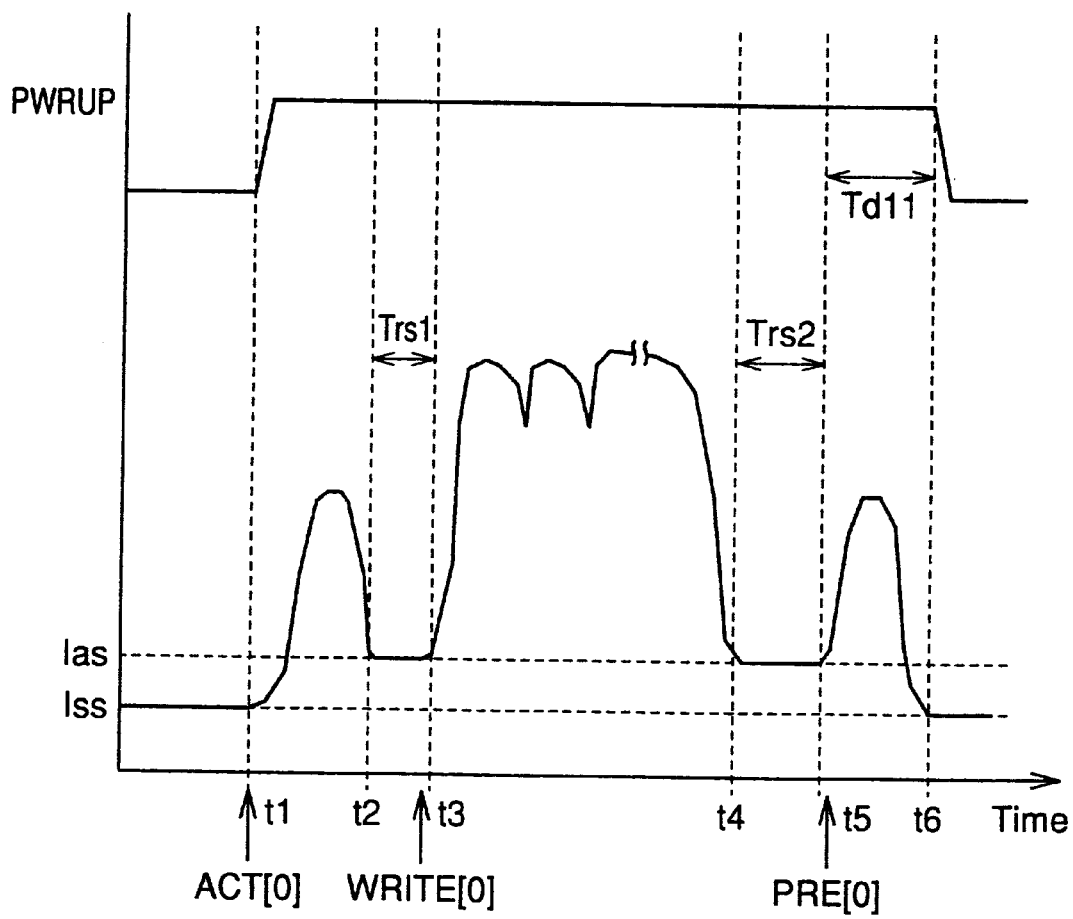
FIG. 23 is a waveform diagram for illustrating a signal PWRUP.

The VDC control circuit 102 refers to only the signal ACTF in correspondence to the ACT command shown in FIG. 4. While the VDC control circuit 532 shown in FIG. 21 refers to the activation signals ZRASE0 to ZRASE3 after transmitted to the respective banks 0 to 3, the VDC control circuit 102 shown in FIG. 4 refers to no bank address dissimilarly to the prior art. In other words, the VDC control circuit 102 operates when externally receiving the ACT command regardless of the banks 0 to 3.

Operations of the VDC control circuit 102 are now briefly described. When the signal ACTF goes high, the P-channel MOS transistor 112 is rendered conductive since its gate goes low. The capacitor 126 provided in the RC delay circuit 116 is charged. The latch circuit 118 is set and the signal PWRUP is activated high. The signal ACTF, which is a pulse generated only in a period when the clock signal CLKI goes high, goes low in a next cycle following input of the ACT command. However, the latch circuit 118 is set by this pulse to hold a latch result.

Upon a lapse of a short time after the signal ACTF goes low, the N-channel MOS transistor 114 is rendered conductive. Then, charges stored in the capacitor 126 through the resistor 124 are discharged toward the ground node. Following progress of this discharge, the input of the NAND circuit 130 goes low to reset the latch circuit 118. The signal PWRUP is responsively inactivated low.

As described above, a pulse signal having a width decided by the resistance value and the capacitance value of the resistor 124 and the capacitor 126 included in the RC delay circuit 116 and the threshold of the NAND circuit 130 can be generated on the basis of the ACT command. It is also possible to increase/decrease the time for increasing the through current Ic of the comparator 72 by making the delay time of the RC delay circuit 116 adjustable.

Figure 5:
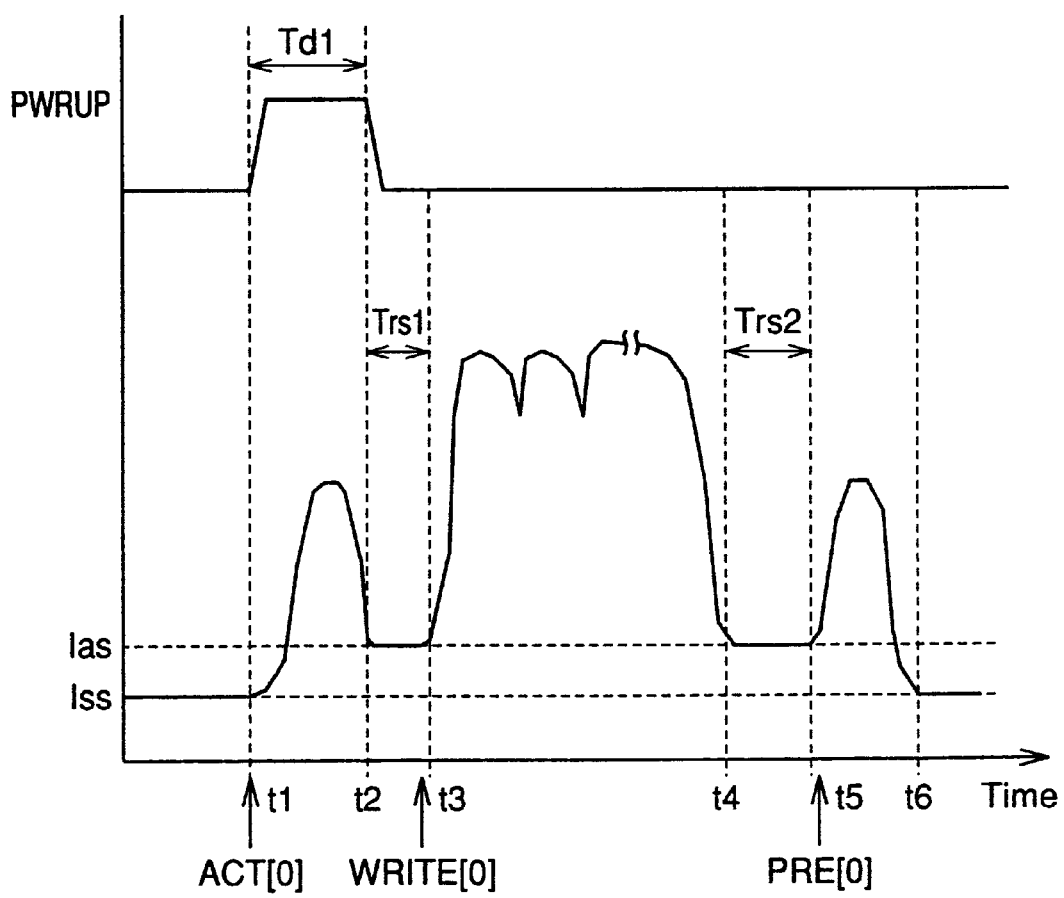
FIG. 5 illustrates a waveform of the signal PWRUP appearing when a command ACT[0] is input.

FIG. 5 illustrates a waveform of the signal PWRUP appearing when a command ACT[0] is input.

Referring to FIG. 5, the signal PWRUP is activated by a delay time Td1 decided by the RC delay circuit 116 shown in FIG. 4 after the command ACT[0] is input.

Figure 26:
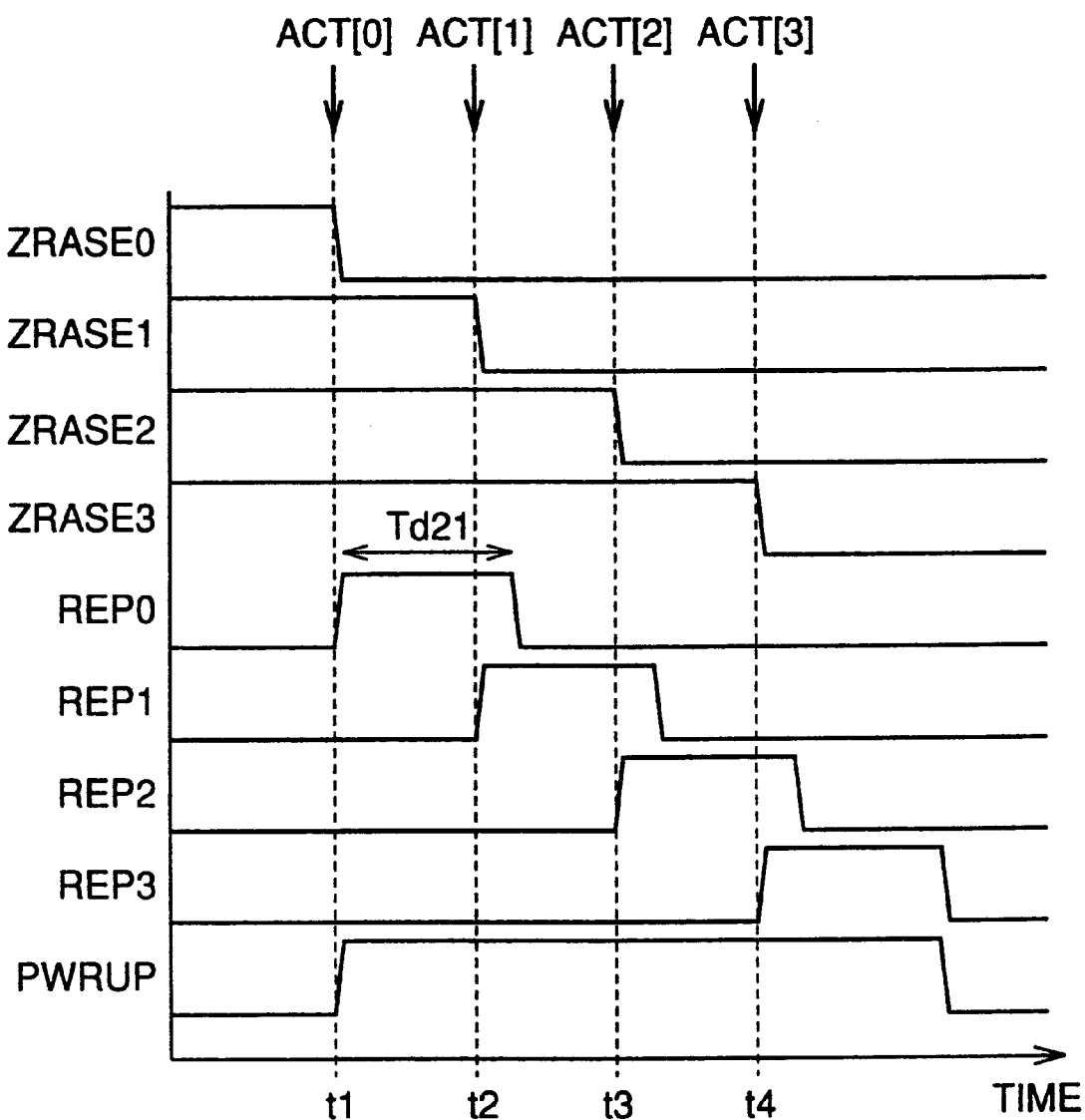
FIG. 26 is an operating waveform diagram showing waveforms appearing when commands ACT[0] to ACT[3] are continuously input in the circuit shown in FIG. 25.

In this circuit structure, the latch circuit 118 shown in FIG. 4 is set and the capacitor 126 in the RC delay circuit is re-charged every time an ACT command is input, even when ACT commands are continuously input at a short interval shown in FIG. 26, whereby the signal PWRUP is kept high and remains in an active state. In other words, the signal PWRUP is inactivated low upon a lapse of the delay time Td1 from the finally input ACT command.

Figure 25:
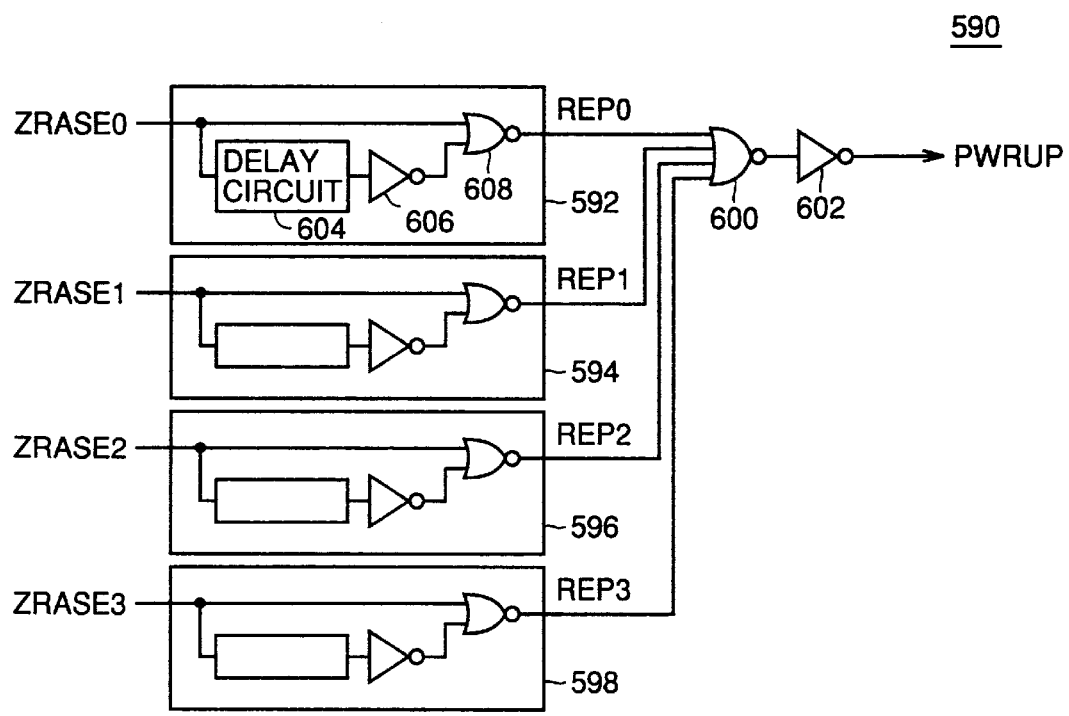
FIG. 25 is a circuit diagram showing the structure of a circuit 590 controlling activation of the signal PWRUP corresponding to an ACT command.

Therefore, the semiconductor memory device 1 not only can perform operations absolutely similar to those in the circuit structure shown in FIG. 25 but also has an advantage in terms of area penalty since the same requires only a single delay circuit. Further, it is not necessary to provide a plurality of wires between the banks 0 to 3 and the VDC control circuit 102 arranged in proximity to the voltage down convertor 36, whereby the area of a wiring region in the chip can be reduced.

As described above, the semiconductor memory device 1 according to the first embodiment generates a control pulse with reference to only input of an ACT command regardless of the bank address. The control pulse has a pulse width corresponding to the internally decided delay time, and the through current Ic can be properly controlled also when ACT commands are continuously input. Further, the semiconductor memory device 1 may not have a plurality of delay stages and hence the circuit area can be reduced.

A control signal for the voltage down convertor 36 for compensating for increase of current consumption in an operation of inactivating a row-system circuit can also be generated by providing a circuit having a similar structure.

When the row-system circuit operates in a cycle decided by an internal counter in a self refresh mode, it is possible to make the response speed of the voltage down convertor 36 responsive to increase of the power supply current in activation of the row-system circuit in the self refresh mode by supplying an output of the internal counter to the VDC control circuit 102 in place of the signal ACTF.

[Second Embodiment]

The first embodiment 1 has been described with reference to a structure for generating a control signal for the voltage down convertor 36 compensating for increase of current consumption in activation of the rowsystem circuit. In a second embodiment of the present invention, consideration is made to the case of compensating for the current consumption immediately after input of an inactivation command for the row-system circuits in addition to the current consumption immediately after input of an activation command for the row-system circuit.

Figure 6:
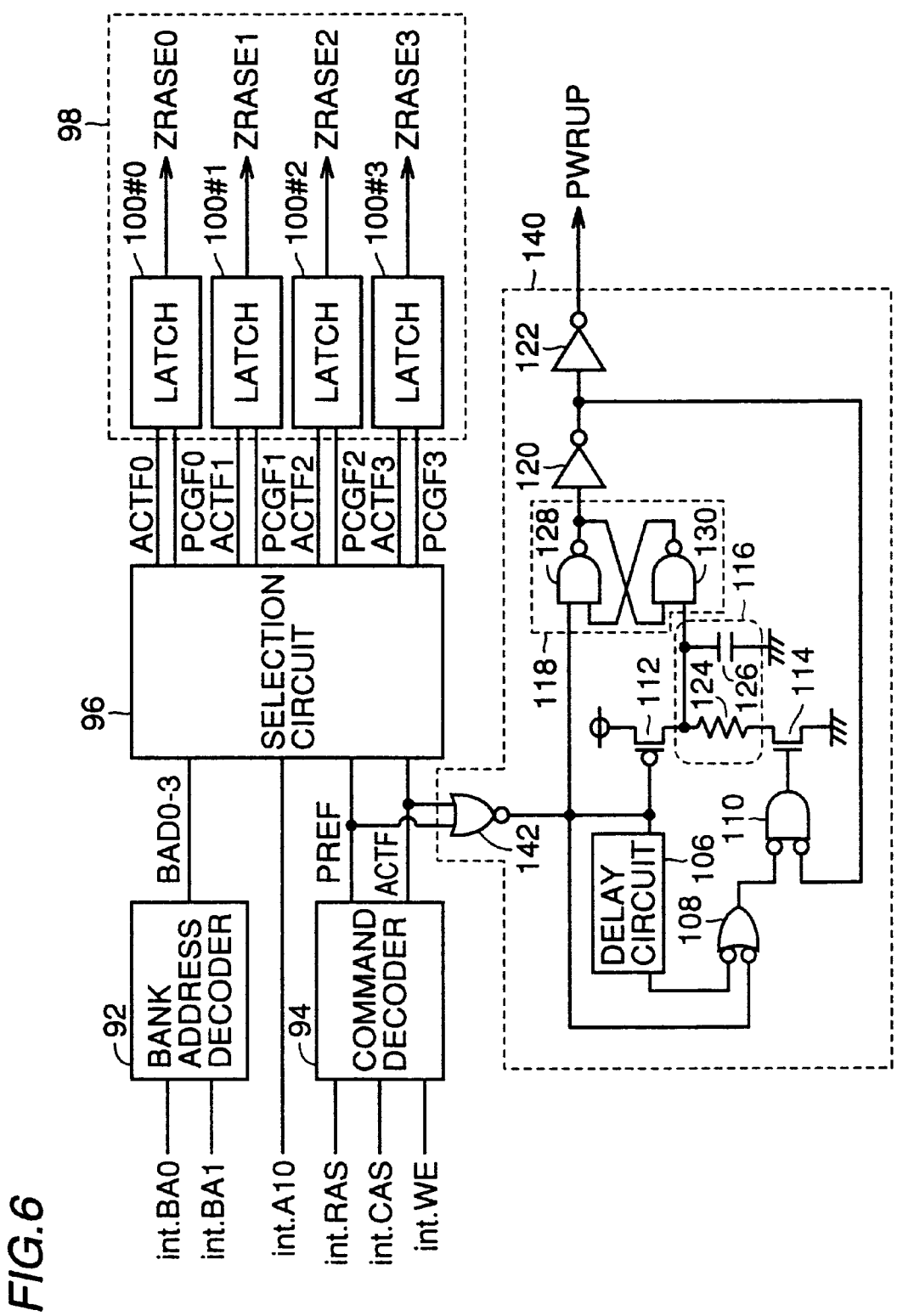
FIG. 6 is a circuit diagram showing the structure of a VDC control circuit 140 employed in a semiconductor memory device according to a second embodiment of the present invention.

FIG. 6 is a circuit diagram showing the structure of a VDC control circuit 140 employed in a semiconductor memory device according to the second embodiment of the present invention.

Referring to FIG. 6, the VDC control circuit 140 is different from the VDC control circuit 102 in the first embodiment in a point that the same includes a NOR circuit 142 receiving signals PREF and ACTF in place of the invertor 104 in the structure of the VDC control circuit 102 shown in FIG. 4. The remaining structure is similar to that shown in FIG. 4 and hence redundant description is not repeated.

The VDC control circuit 140 generates a control signal PWRUP for coping with increase of current consumption resulting from ACT and PRE commands. The ACT and PRE commands are identical to each other in a point that current consumption is increased as viewed from the voltage down convertor.

Therefore, a method similar to that in the first embodiment can be used in principle. In other words, a latch circuit 118 may be set to charge a capacitor 126 when the signal ACTF or PREF is activated.

Figure 7:
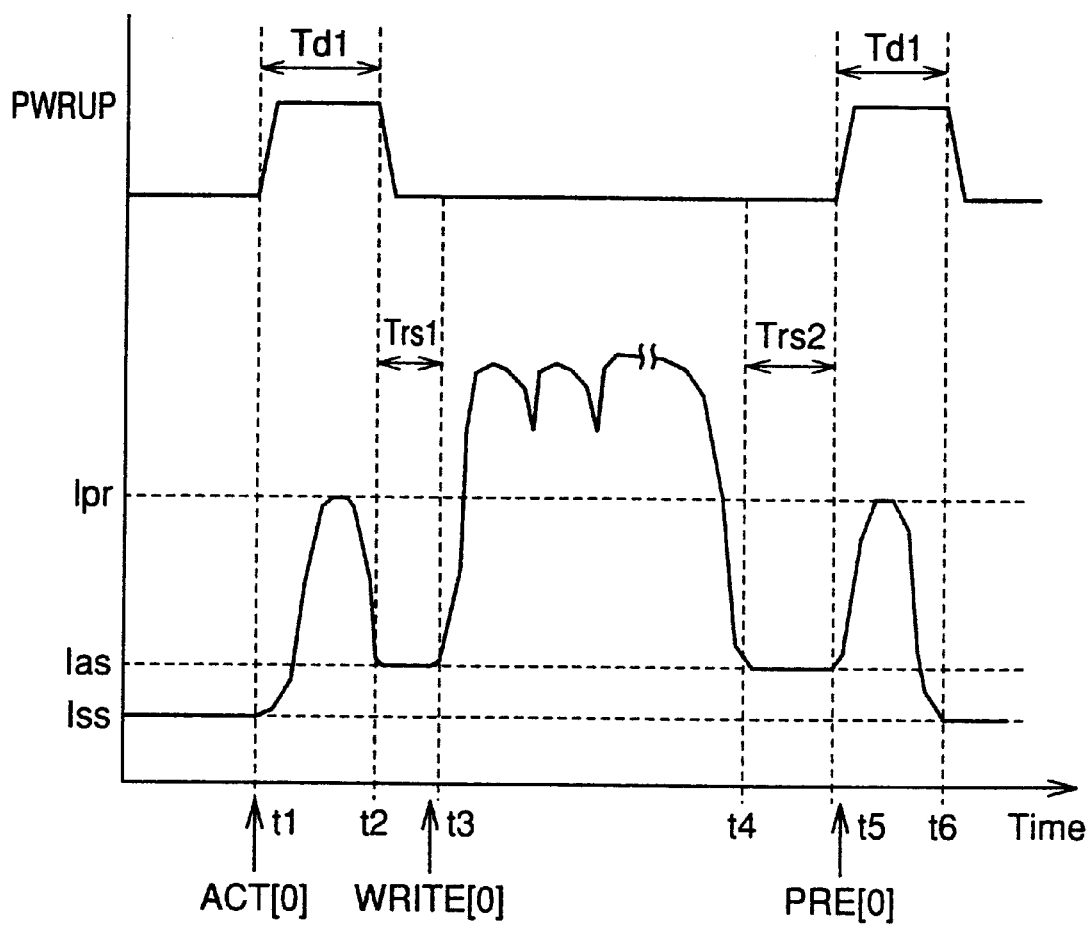
FIG. 7 is a waveform diagram showing a waveform output by the VDC control circuit 140.

FIG. 7 is a waveform diagram showing a waveform output from the VDC control circuit 140.

Referring to FIG. 7, the signal PWRUP is activated by a delay time Td1 decided by an RC delay circuit 116 when a command ACT[0] is input at a time t1. When a command PRE[0] is input at a time t5, the signal PWRUP is responsively activated by the delay time Td1 and thereafter inactivated at a time t6. Such a control method is particularly effective when peaks Ipr of current consumption following ACT and PRE commands are substantially identical to each other and the periods between times t1 and t2 and between times t5 and t6 causing the current peaks are substantially equal to each other.

A through current Ic can be properly controlled with reference to only input of an ACT or PRE command regardless of a bank address due to the aforementioned structure. Thus, it is not necessary to provide a corresponding delay circuit for each bank and the circuit area can be reduced.

[Third Embodiment]

A voltage down convertor generating an operating power supply potential for a peripheral circuit has the largest load in a constant period following input of a READ command or a WRITE command instructing a read/write operation (operation of a column-system circuit). When such a command is input, consumption of a power supply current is abruptly increased and hence a through current Ic must also be increased.

However, the current value of the through current Ic is not allowable in consideration of power supply current consumption in an active standby state. Therefore, the through current Ic must be limitedly increased only in a period when the column-system circuit operates. A third embodiment of the present invention is described with reference to a structure generating a control signal PWRUP increasing the through current Ic in response to an operation of the column-system circuit.

Figure 8:
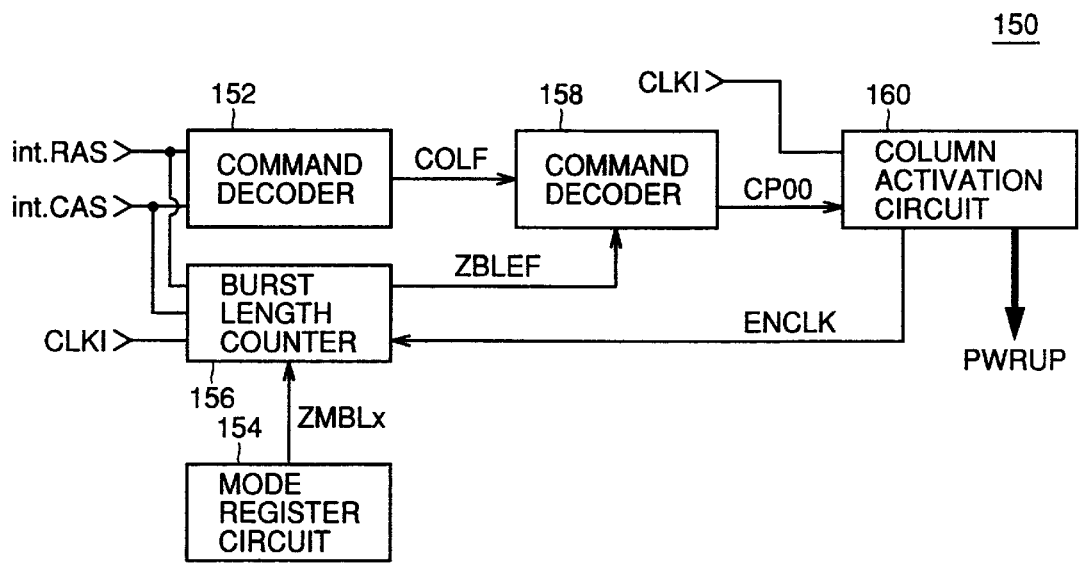
FIG. 8 is a block diagram showing the structure of a VDC control circuit 150 according to a third embodiment of the present invention.

FIG. 8 is a block diagram showing the structure of a VDC control circuit 150 according to the third embodiment. The VDC control circuit can be implemented by sharing circuit elements with the conventional column-system control circuit, and the control signal PWRUP can be generated therefrom.

Referring to FIG. 8, the VDC control circuit 150 includes a command decoder 152 receiving control signals int.RAS and int.CAS and outputting a signal COLF, a mode register set circuit 154 holding setting of a burst length etc., a burst length counter 156 receiving a signal ZMBLx corresponding to the burst length from the mode register set circuit 154 and internally counting a period corresponding to the burst length starting from input of the control signals int.RAS and int.CAS on the basis of a clock signal CLKI, a command decoder 158 receiving the signal COLF and a signal ZBLEF output from the burst length counter 156 and outputting a signal CP00, and a column activation circuit 160 generating the signal PWRUP from the signal CP00 in synchronization with the clock signal CLKI while outputting a signal ENCLK to the burst length counter 156.

Figure 9:
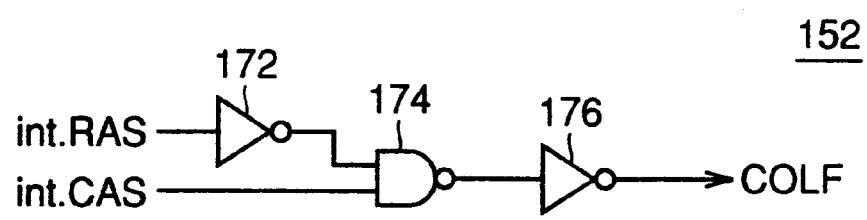
FIG. 9 is a circuit diagram showing the structure of a command decoder 152 appealing in FIG. 8.

FIG. 9 is a circuit diagram showing the structure of the command decoder 152 appearing in FIG. 8.

Referring to FIG. 9, the command decoder 152 includes an invertor 172 receiving and inverting the control signal int.RAS, a NAND circuit 174 receiving the control signal int.CAS and an output of the invertor 172, and an invertor 176 receiving and inverting an output of the NAND circuit 174 and outputting the signal COLF.

Figure 10:
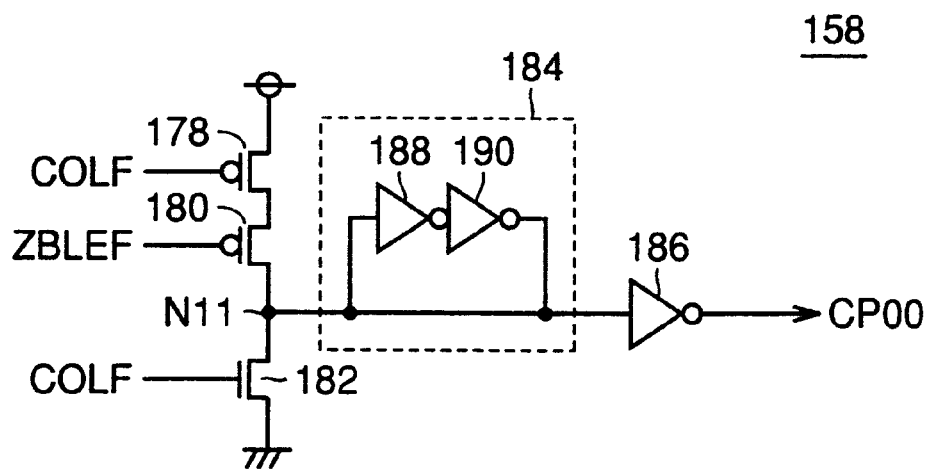
FIG. 10 is a circuit diagram showing the structure of another command decoder 158 appearing in FIG. 8.

FIG. 10 is a circuit diagram showing the structure of the command decoder 158 appearing in FIG. 8.

Referring to FIG. 10, the command decoder 158 includes P-channel MOS transistors 178 and 180 serially connected between a power supply node and a node N11 for receiving the signals COLF and ZBLEF in gates thereof respectively, an N-channel MOS transistor 182 connected between the node N11 and a ground node for receiving the signal COLF in its gate, a latch circuit 184 holding the level of a signal supplied to the node N11 and an invertor 186 receiving the level of the node N11 in its input, inverting the same and outputting the signal CP00. The latch circuit 184 includes an invertor 188 having an input connected to the node N11 and an invertor 190 receiving and inverting an output of the invertor 188 and supplying the inverted output to the node N11.

Figure 11:
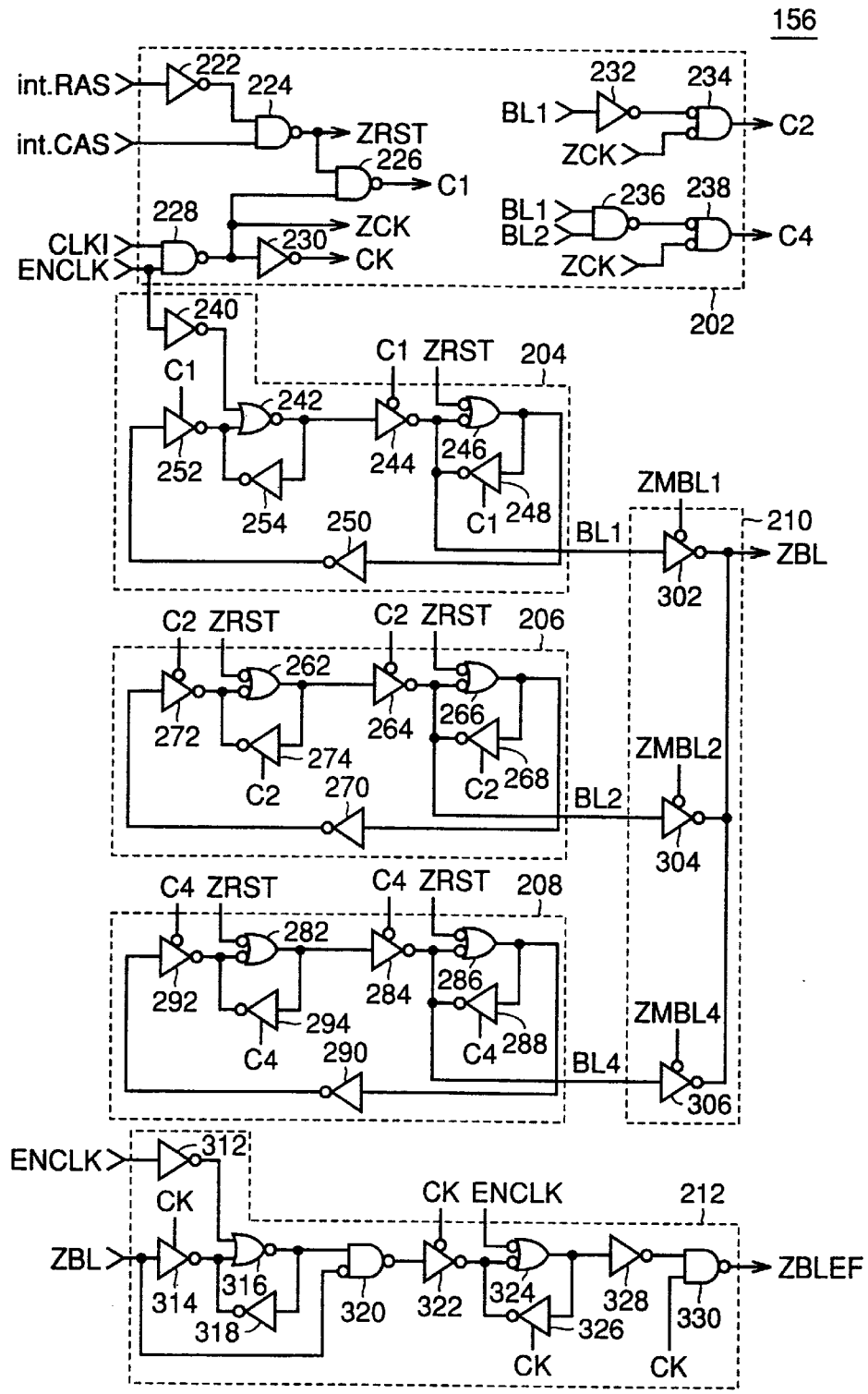
FIG. 11 is a circuit diagram showing the structure of a burst length counter 156 appearing in FIG. 8.

FIG. 11 is a circuit diagram showing the structure of the burst length counter 156 appearing in FIG. 8.

Referring to FIG. 11, the burst length counter 156 includes a clock generation part 202 receiving the clock signal CLKI in response to the control signals int.RAS and int.CAS and the signal ENCLK and generating clock signals C1, C2 and C4, count parts 204, 206 and 208 performing count operations in response to the clock signals C1, C2 and C4 respectively, a selection circuit 210 selecting one of signals BL1, BL2 and BL4 output from the count parts 204, 206 and 208 respectively and outputting a signal ZBL, and a pulse generation part 212 outputting the signal ZBLEF in response to the signals ENCLK and ZBL.

The clock generation part 202 includes an investor 222 receiving and inverting the control signal int.RAS, a NAND circuit 224 receiving the control signal int.CAS and an output of the invertor 222 and outputting a signal ZRST, a NAND circuit 228 receiving the clock signal CLKI and the signal ENCLK and outputting a signal ZCK, an invertor 230 receiving and inverting the signal ZCK and outputting a signal CK, and a NAND circuit 226 receiving the signals ZRST and ZCK and outputting the clock signal C1.

The clock generation part 202 further includes an invertor 232 receiving and inverting the signal BL1, a NOR circuit 234 receiving the signal ZCK and an output of the invertor 232 and outputting the clock signal C2, a NAND circuit 236 receiving the signals BL1 and BL2, and a NOR circuit 238 receiving the signal ZCK and an output of the NAND circuit 236 and outputting the clock signal C4.

The count part 204 includes an invertor 240 receiving and inverting the signal ENCLK, a NOR circuit 242 receiving an output of the invertor 240 in a first input, an invertor 254 receiving and outputting an output of the NOR circuit 242 and supplying the inverted output to a second input of the NOR circuit 242, a clocked invertor 244 activated when the clock signal C1 is low for inverting and outputting the output of the NOR circuit 242, a NAND circuit 246 receiving the output of the clocked invertor 244 and the signal ZRST, a clocked invertor 248 receiving a signal from the NAND circuit 246 and activated when the clock signal C1 is high for outputting an inverted signal, an invertor 250 receiving and inverting the output of the NAND circuit 246, and a clocked invertor 252 receiving an output of the invertor 250 and activated when the clock signal C1 is high for supplying an inverted output to the second input of the NOR circuit 242.

The outputs of the clocked invertors 244 and 248 are supplied to the same node, which in turn outputs the signal BL1.

The count part 206 includes a NAND circuit 262 supplied with the signal ZRST in a first input, a clocked invertor 274 receiving an output of the NAND circuit 262 and activated when the clock signal C2 is high for supplying the output to a second input of the NAND circuit 262, a clocked invertor 264 receiving the output of the NAND circuit 262 and activated when the clock signal C2 is low for outputting an inverted signal, a NAND circuit 266 receiving the signal ZRST and the output of the clocked invertor 264, an invertor 270 receiving and inverting an output of the NAND circuit 266, a clocked invertor 272 receiving an output of the NAND circuit 270 and activated when the clock signal C2 is low for outputting an inverted signal, and a clocked invertor 268 receiving the output of the NAND circuit 266 and activated when the clock signal C2 is high for outputting an inverted signal.

The outputs of the clocked invertors 272 and 274 are supplied to the second input of the NAND circuit 262. The outputs of the clocked invertors 264 and 268 are connected to the same node, which in turn outputs the signal BL2.

The count part 208 includes a NAND circuit 282 supplied with the signal ZRST in a first input, a docked invertor 294 receiving an output of the NAND circuit 282 and activated when the clock signal C4 is high for supplying the output to a second input of the NAND circuit 282, a clocked invertor 284 receiving an output of the NAND circuit 282 and activated when the clock signal C4 is low for outputting an inverted signal, a NAND circuit 286 receiving the signal ZRST and the output of the clocked invertor 284, an invertor 290 receiving and inverting an output of the NAND circuit 286, a docked invertor 292 receiving an output of the invertor 290 and activated when the clock signal C4 is low for outputting an inverted signal, and a clocked invertor 288 receiving the output of the NAND circuit 286 and activated when the clock signal C4 is high for outputting an inverted signal.

The outputs of the clocked invertors 292 and 294 are supplied to the second input of the NAND circuit 282. The outputs of the clocked invertors 284 and 288 are connected to the same node, which in turn outputs the signal BL4.

The selection circuit 210 includes a clocked invertor 302 activated by a signal ZMBL1 set low when the burst length is 1 for inverting the signal BL1 and outputting the signal ZBL, a clocked invertor 304 activated by a signal ZMBL2 set low when the burst length is 2 for receiving and inverting the signal BL2 and outputting the signal ZBL, and a clocked invertor 306 activated by a signal ZMBL4 set low when the burst length is 4 for receiving and inverting the signal BL4 and outputting the signal ZBL.

The pulse generation part 212 includes an invertor 312 receiving and inverting the signal ENCLK, a clocked invertor 314 activated when the signal CK is high for receiving and inverting the signal ZBL, a NOR circuit 316 receiving outputs of the invertor 312 and the clocked invertor 314, an invertor 318 receiving and inverting an output of the NOR circuit 316 and supplying the inverted output to an output node of the clocked invertor 314, and a gate circuit 320 receiving the output of the NOR circuit 316 and the signal ZBL. The gate circuit 320 outputs the NAND of the output of the NOR circuit 316 and an inverted signal of the signal ZBL.

The pulse generation part 212 further includes a clocked invertor 322 receiving the output of the gate circuit 320 and activated when the signal CK is low for outputting an inverted signal, a NAND circuit 324 receiving the signal ENCLK and the output of the clocked invertor 322, a clocked invertor 326 receiving an output of the NAND circuit 324 and activated when the signal CK is high for supplying an inverted output to an output node of the clocked invertor 322, an invertor 328 receiving and inverting the output of the NAND circuit 324, and a NAND circuit 330 receiving an output of the invertor 328 and the signal CK and outputting the signal ZBLEF.

Figure 12:
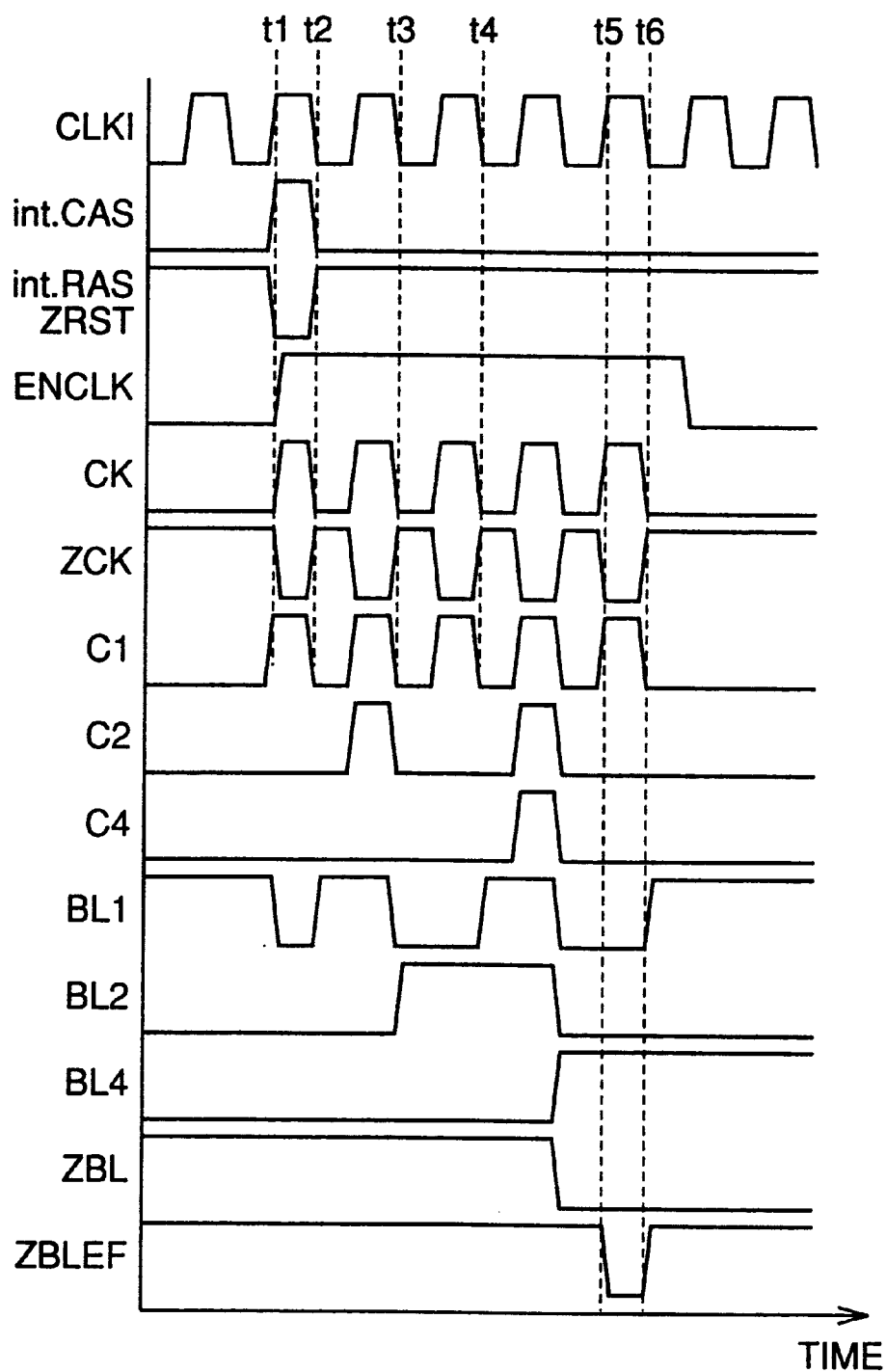
FIG. 12 is an operation waveform diagram for illustrating operations of the command decoders 152 and 158 and the burst length counter 156 appearing in FIGS. 9 to 11.

FIG. 12 is an operation waveform diagram for illustrating operations of the command decoders 152 and 158 and the burst length counter 156 shown in FIGS. 9 to 11.

Referring to FIG. 12, a command is input in the semiconductor memory device at a time t1 due to change of the control signals int.CAS and int.RAS. In the command decoder 152 shown in FIG. 9, the signal COLF is activated when a read command or a write command is input in response to these signals int.CAS and int.RAS.

The reference signal CP00 is responsively activated in the command decoder 158 shown in FIG. 10. In response to activation of the signal CP00, a column activation circuit 160 described later outputs the signal ENCLK validating a clock for a constant period. While the signal ENCLK is activated, the clock generation part 202 shown in FIG. 11 generates the signals CK and ZCK and the clock signals C1, C2 and C4 on the basis of the clock signal CLKI. Between the time t1 and a time t2, the count parts 204, 206 and 208 are reset by the signal ZRST output from the clock generation part 202.

When the reset is canceled at the time t2, the count part 204 starts counting in response to fall of the clock signal C1, and the count part 206 starts counting in response to fall of the clock signal C2. Similarly, the count part 208 starts counting in response to fall of the clock signal C4.

One of the signals BL1, BL2 and BL4 output from the count parts 204, 206 and 208 is selected on the basis of the ZMBL1, ZMBL2 and ZMBL4 indicating burst lengths received from the mode register set circuit 154.

In the exemplary waveforms shown in FIG. 12, the signal ZMBL4 indicating that the burst length is 4 is low and activated. The signals ZMBL1 and ZMBL2 are high and inactivated.

Therefore, the signal BL4 is output for the signal ZBL and the pulse generation part 212 initializes the signal ZBLEF low between times t5 and t6, and the command decoder 158 shown in FIG. 10 is responsively initialized and the signal CP00 goes low.

While a READ command or a WRITE command is input with a bank address, no bank address is referred to in the aforementioned structure. Input of the READ command or the WRITE command can be determined by a combination of the control signals int.RAS and int.CAS, and hence the command decoder 152 responsively activates the control signal COLF. While the READ command and the WRITE command are distinguished from each other through a control signal int.WE, column-system power supply control can be performed in common to the commands and hence the control signal int.WE is not used.

Figure 13:
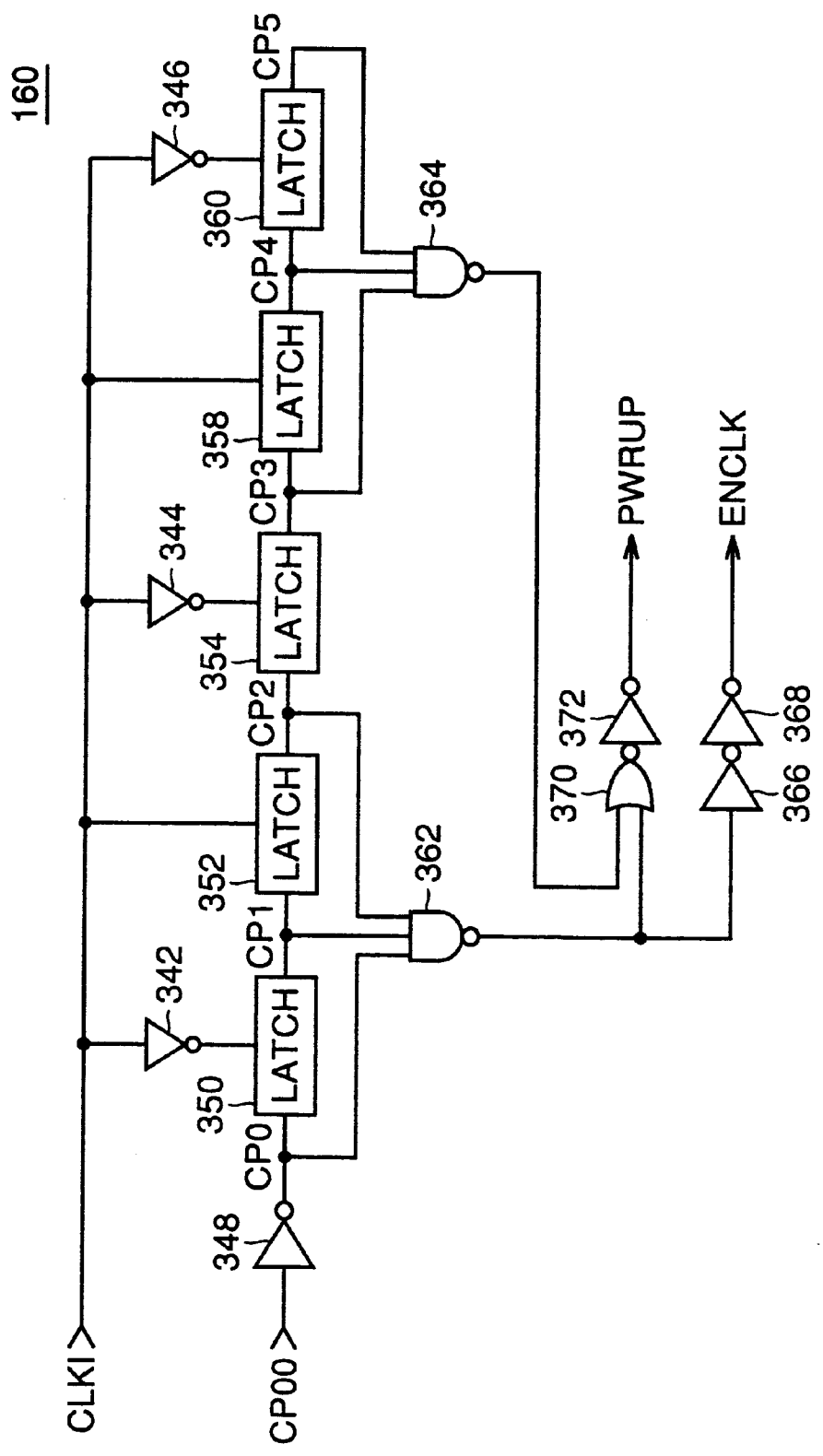
FIG. 13 is a circuit diagram showing the structure of a column activation circuit 160 appearing in FIG. 8.

FIG. 13 is a circuit diagram showing the structure of the column activation circuit 160 appearing in FIG. 8.

Referring to FIG. 13, the column activation circuit 160 includes an invertor 348 receiving the signal CP00 output from the command decoder 158, inverting the same and outputting a signal CP0, invertors 342, 344 and 346 receiving and inverting the clock signal CLKI, a latch 350 latching the signal CP0 in response to an output of the invertor 342, a latch 352 latching an output signal CP1 from the latch 350 in response to the clock signal CLKI, a latch 354 latching an output signal CP2 from the latch 352 in response to an output of the invertor 344, a latch 358 latching an output signal CP3 from the latch 354 in response to the clock signal CLKI, and a latch 360 latching an output signal CP4 from the latch 358 in response to an output signal of the invertor 346.

The column activation circuit 160 further includes a NAND circuit 362 receiving the signals CP0, CP1 and CP2, a NAND circuit 364 receiving the signals CP3 and CP4 and an output signal CP5 from the latch 360, an invertor 366 receiving and inverting an output of the NAND circuit 362, an invertor 368 receiving and inverting an output of the invertor 366 and outputting the signal ENCLK, a NOR circuit 370 receiving the outputs of the NAND circuits 362 and 364, and an invertor 372 receiving and inverting an output of the NOR circuit 370 and outputting the signal PWRUP.

Figure 14:
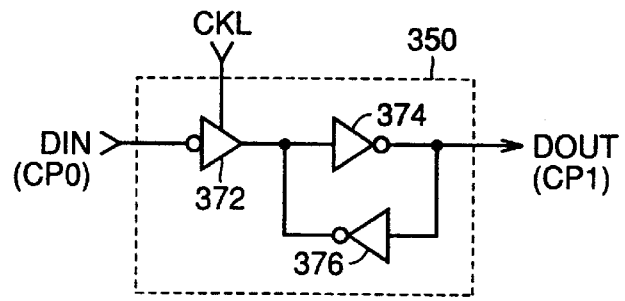
FIG. 14 is a circuit diagram showing the structure of a latch 350 appearing in FIG. 13.

FIG. 14 is a circuit diagram showing the structure of the latch 350 appearing in FIG. 13.

Referring to FIG. 14, the latch 350 includes a clocked invertor 372 receiving an input signal DIN and activated in response to a clock signal CKL, an invertor 374 receiving and inverting an output of the clocked invertor 372 and outputting a signal DOUT, and an invertor 376 receiving and inverting the output of the invertor 374 and feeding back the inverted output to an input of the invertor 374.

The input signal DIN corresponds to the signal CP0 in FIG. 13. The signal DOUT corresponds to the signal CP1 shown in FIG. 13. The clock signal CKL corresponds to the output of the invertor 342 shown in FIG. 13.

The latches 352 to 360 shown in FIG. 13 are similar in structure to the latch 350, and hence redundant description is not repeated.

Figure 15:
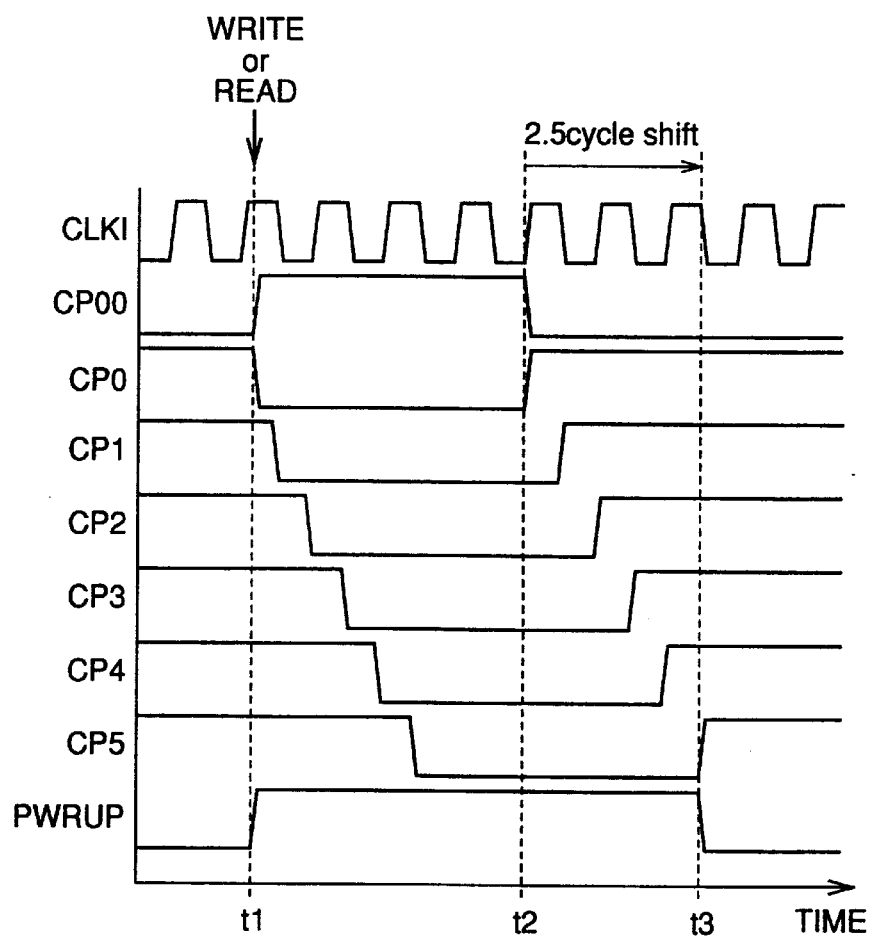
FIG. 15 is an operation waveform diagram for illustrating operations of the column activation circuit 160.

FIG. 15 is an operation waveform diagram for illustrating operations of the column activation circuit 160.

Referring to FIGS. 13 and 15, the signal CP00 is activated through the command decoders 152 and 158 shown in FIGS. 9 and 10 respectively and the signal PWRUP is responsively activated when a WRITE command or a READ command is input at a time t1. The latches 350 to 360 delay the leading edge thereof by 0.5 clock.

The signal CP00 is inactivated at a time t2 in response to fall of the signal ZBLEF shown in FIG. 12. The latches 350 to 360 also delay the trailing edge of the signal CP00, so that the trailing edge of the signal PWRUP lags that of the signal CP00 by 2.5 clock cycles.

A write operation resulting from a WRITE command requires a time for precisely writing final data in a cell before a row-precharge operation resulting from a PRE command, i.e., a write recovery time tWR. A read operation requires a delay time before actually reading data from a DQ pin, i.e., a CAS latency (CL).

In other words, an internal circuit operates for a time longer than the burst length in response to the command. The signal PWRUP must be activated for a time longer than the burst length in response to the command. The write recovery time tWR or the CAS latency is defined in the standard of a synchronous semiconductor memory device, and hence a column-system activation period is obtained by extending the burst length by a defined cycle.

In other words, the column activation circuit 160 generates a signal whose falling edge is delayed by 2.5 clocks from that of the signal CP00. A period when a large power supply current is consumed matches with the column-system activation period, and hence this circuit output can be used for controlling a through current Ic of a voltage down convertor VDC as the signal PWRUP.

The column activation circuit 160 also outputs the signal ENCLK activating a burst counter whose falling edge is delayed by 1.5 clocks from that of the signal CP00.

The signal PWRUP instructing an operation of increasing the through current Ic for a period when a column-system operation is performed can be generated in the aforementioned manner. The circuit structure shown in relation to the third embodiment is irrelevant to no bank address.

The circuits other than the column activation circuit 160, which are essentially required for the column-system operation itself, can be shared for generating the control signal PWRUP.

Therefore, the through current Ic can be optimally controlled against increase of the consumed current in the column-system operation with a small number of additional circuits, without depending on the bank address.

[Fourth Embodiment]

When covering change of a power supply current by row-system and column-system operations with a single voltage down convertor (VDC), the structures for generating the control signals PWRUP shown in the first to third embodiments can be employed in combination.

Figure 16:
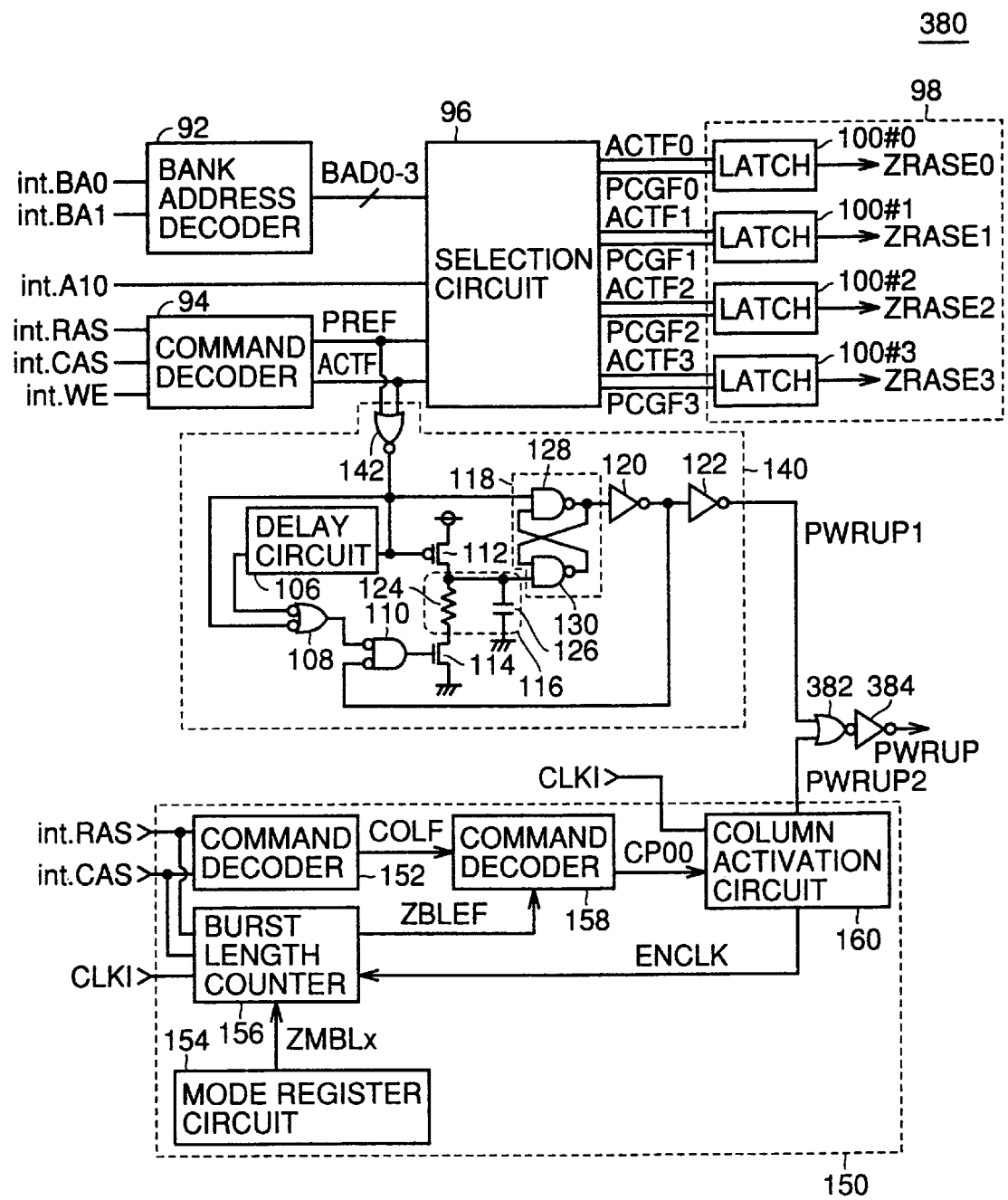
FIG. 16 is a circuit diagram showing the structure of a VDC control circuit 380 employed in a fourth embodiment of the present invention.

FIG. 16 is a circuit diagram showing the structure of a VDC control circuit 380 employed in a fourth embodiment of the present invention.

Referring to FIG. 16, the VDC control circuit 380 includes the VDC control circuit 140 shown in FIG. 6 and the VDC control circuit 150 shown in FIG. 8. The output signal of the VDC control circuit 140 is used as a signal PWRUP1, and the output signal of the VDC control circuit 150 is used as a signal PWRUP2. The structures of the VDC control circuits 140 and 150 have been described with reference to FIGS. 6 and 8, and hence redundant description is not repeated.

The VDC control circuit 380 further includes a NOR circuit 382 receiving the signals PWRUP1 and PWRUP2 and an invertor 384 receiving and inverting an output of the NOR circuit 382 and outputting a signal PWRUP.

Figure 24:
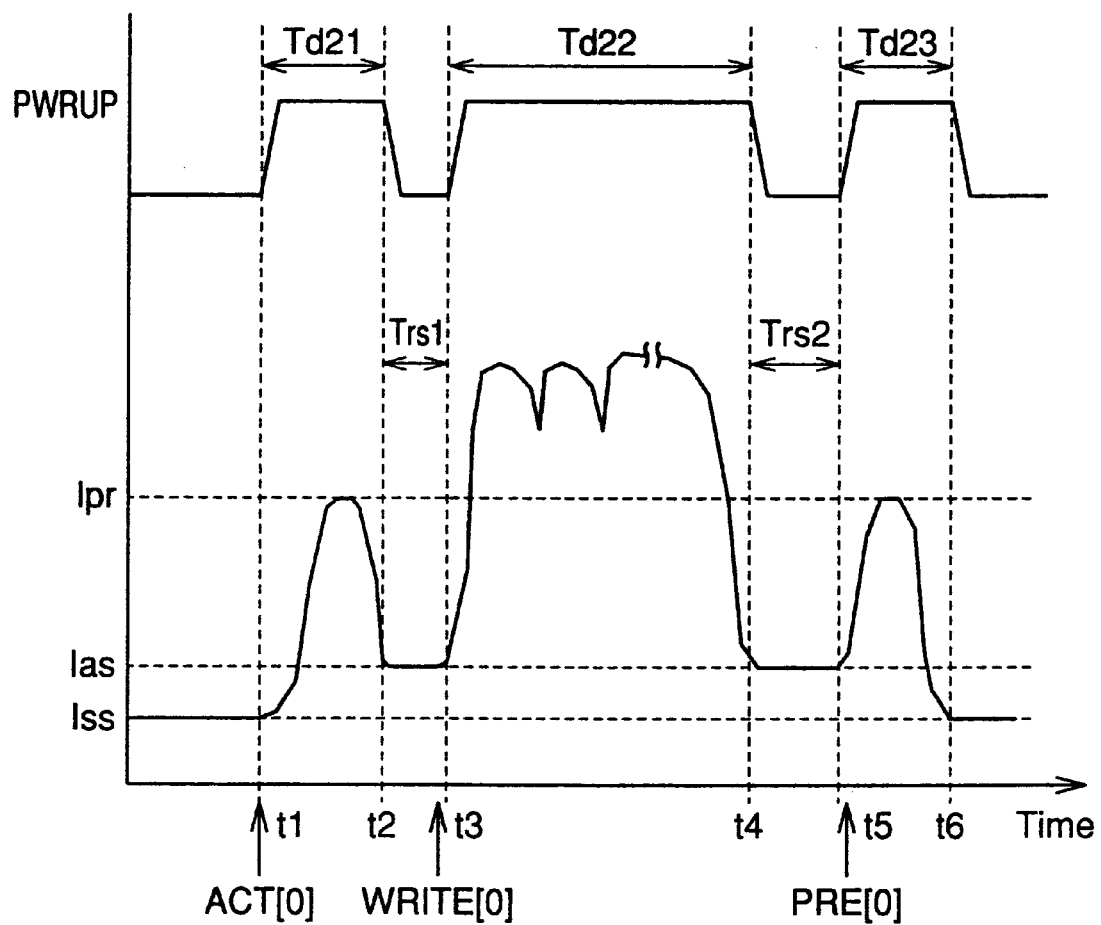
FIG. 24 is a waveform diagram for studying a waveform of the signal PWRUP for controlling a through current Ic of a comparator with more fidelity to increase/decrease of current consumption.

When an ACT or PRE command activates a row-system circuit and a WRITE or READ command activates a column-system circuit, the signal PWRUP goes high to increase a through current Ic due to the aforementioned structure. In other words, a waveform similar to that of the signal PWRUP described with reference to FIG. 24 can be formed.

Thus, control of a voltage down convertor capable of coping with complicated change of power supply current consumption is enabled in a simple circuit structure regardless of a bank address.

[Fifth Embodiment]

According to the fourth embodiment, the signal PWRUP1 deciding a period corresponding to power supply current consumption resulting from activation of the row-system circuit and the signal PWRUP2 deciding a period corresponding to increase of power supply current consumption resulting from activation of the column-system circuit are combined with each other to generate the signal PWRUP. This is a method preferably employable when using the VDC 36 shown in FIG. 3. Alternatively, the number of transistors controlling a through current Ic may be increased for strictly switching the through current Ic with a single comparator in response to a load for coping with change of power supply current consumption.

Figure 17:
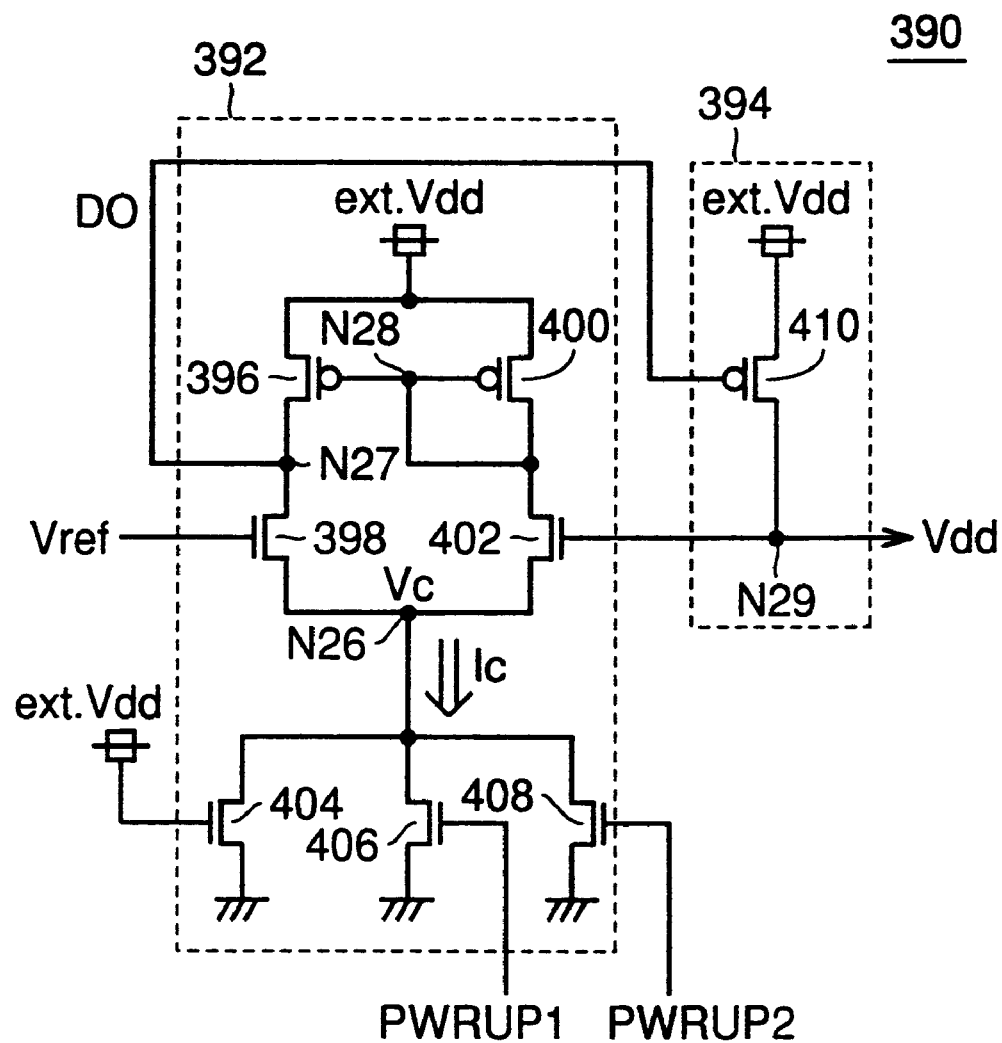
FIG. 17 is a circuit diagram showing the structure of a VDC 390 employed in place of the VDC 36 in a fifth embodiment of the present invention.
Figure 18:
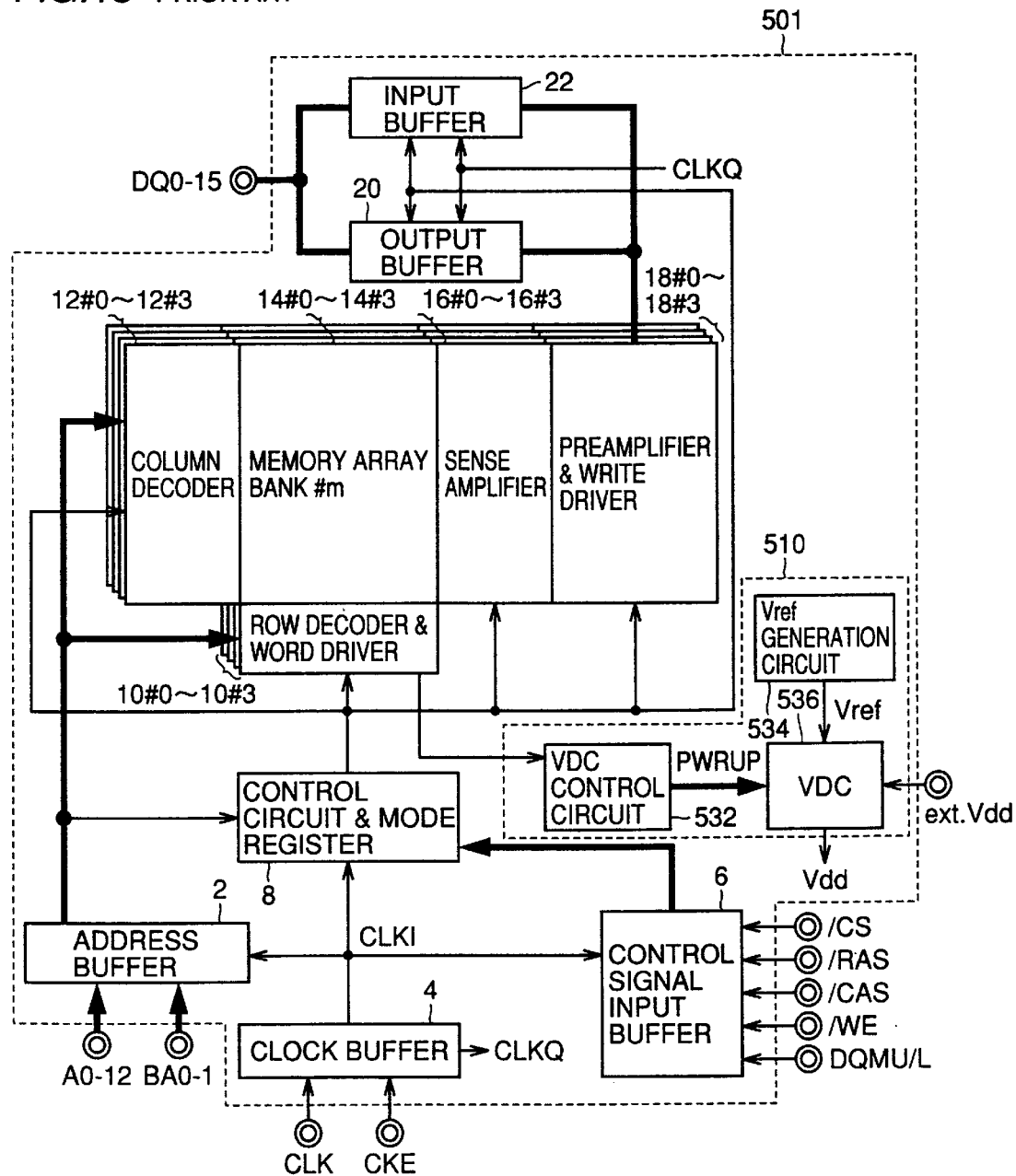
FIG. 18 is a block diagram showing the structure of a synchronous dynamic random access memory (SDRAM) 501 as an exemplary conventional semiconductor chip.

FIG. 17 is a circuit diagram showing the structure of a voltage down convertor (VDC) 390 according to a fifth embodiment of the present invention, which is employed in place of the VDC 36.

Referring to FIG. 17, the voltage down convertor 390 includes a comparator 392 comparing a power supply potential Vdd with a reference potential Vref and outputting a comparison result signal DO, and a driver 394 driving the power supply potential Vdd on the basis of an external power supply potential ext.Vdd on the basis of the comparison result signal DO.

The comparator 392 includes a P-channel MOS transistor 396 connected between a node supplied with the external power supply potential ext.Vdd and a node N27 with a gate connected to a node N28, an N-channel MOS transistor 398 connected between the node N27 and a node N26 with a gate coupled to the reference potential Vref, a P-channel MOS transistor 400 connected between the node supplied with the external power supply potential ext.Vdd and the node N28 with a gate connected to the node N28, an N-channel MOS transistor 402 connected between the nodes N28 and N26 with a gate coupled to the power supply potential Vdd, an N-channel MOS transistor 404 connected between the node N26 and a ground node with a gate coupled to the external power supply potential ext.Vdd, an N-channel MOS transistor 406 connected between the node N26 and the ground node for receiving a signal PWRUP1 in its gate, and an N-channel MOS transistor 408 connected between the node N26 and the ground node for receiving a signal PWRUP2 in its gate.

The node N27 outputs the comparison result signal DO output from the comparator 392.

The driver 394 includes a P-channel MOS transistor 410 connected between a node supplied with the external power supply potential ext.Vdd and a node N29 for receiving the comparison result signal DO in its gate. The node N29 outputs the power supply potential Vdd to each block of a semiconductor memory device.

A through current Ic is controlled by the N-channel MOS transistor 404 regularly in a conductive state, the N-channel MOS transistor 406 receiving the signal PWRUP1 indicating activation of a row-system circuit in its gate and the N-channel MOS transistor 408 receiving the signal PWRUP2 indicating activation of a column-system circuit in its gate. The size of the N-channel MOS transistor 406 is decided in correspondence to increase of current consumption following activation of the row-system circuit. The size of the N-channel MOS transistor 408 is decided in correspondence to increase of current consumption following activation of the column-system circuit.

Also when the quantities of power supply current consumption are different between activation of the row-system circuit and activation of the column-system circuit, values of the through current Ic optimum for the respective states can be set due to the aforementioned structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a command receiving circuit receiving a supplied, command designation signal to output a command;
   an address receiving circuit receiving a supplied address designation signal to output a row address, a column address and a bank address;
   a first internal circuit operating in response to the command, the row address, the column address and the bank address, said first internal circuit including
      a plurality of banks each having a plurality of memory cells arranged in rows and columns and activated in response to said command and said bank address,
      a plurality of row-system circuits each provided in correspondence to each said bank for performing an operation related to selection of a row of said memory cells in response to said command and said row address, and
      a plurality of column-system circuits each provided in correspondence to each said bank for performing an operation related to selection of a column of said memory cells in response to said command and said column address; and
   a second internal circuit operating in response to said command, said second internal circuit including
      a power supply circuit supplying an operating power supply potential to said first internal circuit, said power supply circuit having
         a reference potential generation circuit generating a reference potential defining a target value of said operating power supply potential,
         a voltage down convertor stepping down an external power supply potential to the level of said reference potential and outputting said operating power supply potential, and
         a response speed control circuit controlling an activation period and a response speed of said voltage down convertor according to said command,
      said voltage down convertor having
         a driving circuit receiving said external power supply potential and driving an output of said voltage down convertor, and
         a compare circuit controlling said driving circuit, said compare circuit having
            a current limitation part supplying an operating current including a first current and a second current that is added in response to an output of said response speed control circuit, and
            a compare part comparing the operating power supply potential with the reference potential at said response speed responsive to said operating current.

2. The semiconductor memory device according to claim 1, wherein
   said command includes a first command group; and
   said current limitation part includes
   a first current limitation circuit feeding said first current corresponding to the response speed in an inactive state of said output of said response speed control circuit, and
   a second current limitation circuit provided in parallel with said first current limitation circuit for feeding said second current corresponding to said first command group in response to activation of said output of said response speed control circuit.

3. The semiconductor memory device according to claim 2, wherein
   said command further includes a second command group; and
   said current limitation part further includes
   a third current limitation circuit provided in parallel with said first current limitation circuit for feeding a third current corresponding to said second command group in response to activation of said output of said response speed control circuit.

4. A semiconductor memory device, comprising:
   a command receiving circuit receiving a supplied, command designation signal to output a command;
   an address receiving circuit receiving a supplied address designation signal to output a row address, a column address and a bank address;
   a first internal circuit operating in response to the command, the row address, the column address and the bank address, said first internal circuit including
      a plurality of banks each having a plurality of memory cells arranged in rows and columns and activated in response to said command and said bank address,
      a plurality of row-system circuits each provided in correspondence to each said bank for performing an operation related to selection of a row of said memory cells in response to said command and said row address, and
      a plurality of column-system circuits each provided in correspondence to each said bank for performing an operation related to selection of a column of said memory cells in response to said command and said column address; and
   a second internal circuit operating in response to said command, said second internal circuit including
      a power supply circuit supplying an operating power supply potential to said first internal circuit, said power supply circuit having
         a reference potential generation circuit generating a reference potential defining a target value of said operating power supply potential, a voltage down convertor stepping down an external power supply potential to the level of said reference potential and outputting said operating power supply potential, and a response speed control circuit controlling an activation period and a response speed of said voltage down convertor according to said command, wherein said response speed control circuit includes:

a detection circuit detecting input of said command;

a first delay circuit delaying an output of said detection circuit by a time corresponding to said activation period and outputting an activation end signal; and a state holding circuit having an output activated in response to said output of said detection circuit and inactivated in response to said activation end signal.

5. The semiconductor memory device according to claim 4, wherein said command includes a row-system command instructing control of said row-system circuit;

said detection circuit has a row command detection circuit detecting input of said row-system command; and said first delay circuit has a capacitor storing charges in response to an output of said row command detection circuit, and a resistive element for discharging said charges in a time corresponding to said activation period.

6. The semiconductor memory device according to claim 5, wherein said row-system command includes:

a row operation start instruction command instructing start of the operation of said row-system circuit; and a row operation end instruction command instructing end of said operation of said row-system circuit.

7. The semiconductor memory device according to claim 5, wherein said response speed control circuit further has a first switching circuit rendered conductive in response to said output of said row command detection circuit for supplying a first potential to an end of said capacitor, a second delay circuit receiving, delaying and outputting said output of said row command detection circuit, and a second switching circuit provided on a path coupling said end of said capacitor to a second potential through said resistive element and rendered conductive in response to an output of said second delay circuit; and said first delay circuit outputs said activation end signal in response to the potential of said end of said capacitor.

8. The semiconductor memory device according to claim 4, wherein said command includes a column-system command instructing control of said column-system circuit;

said detection circuit includes a column command detection circuit detecting input of said column-system command; and said first delay circuit has a burst length counter circuit performing a count operation in synchronization with a clock signal in response to an activation of said command and outputting said activation end signal after a time corresponding to a burst length.

9. The semiconductor memory device according to claim 8, wherein said response speed control circuit further includes a column activation pulse generation circuit receiving said output of said state holding circuit and extending said activation period until a circuit operation corresponding to said column-system command is terminated.

10. The semiconductor memory device according to claim 8, wherein said column-system command includes:

a read command for reading data from said memory cell selected by said column-system circuit, and a write command for writing data in said memory cell selected by said column-system circuit.

11. A semiconductor memory device, comprising:

a command receiving circuit receiving a supplied, command designation signal to output a command;

an address receiving circuit receiving a supplied address designation signal to output a row address, a column address and a bank address;

a first internal circuit operating in response to the command, the row address, the column address and the bank address, said first internal circuit including a plurality of banks each having a plurality of memory cells arranged in rows and columns and activated in response to said command and said bank address, a plurality of row-system circuits each provided in correspondence to each said bank for performing an operation related to selection of a row of said memory cells in response to said command and said row address, and a plurality of column-system circuits each provided in correspondence to each said bank for performing an operation related to selection of a column of said memory cells in response to said command and said column address; and a second internal circuit operating in response to said command, said second internal circuit including a power supply circuit supplying an operating power supply potential to said first internal circuit, said power supply circuit having a reference potential generation circuit generating a reference potential defining a target value of said operating power supply potential, a voltage down convertor stepping down an external power supply potential to the level of said reference potential and outputting said operating power supply potential, and a response speed control circuit controlling an activation period and a response speed of said voltage down convertor according to said command, wherein said command includes a row-system command instructing control of said row-system circuit, and a column-system command instructing control of said column-system circuit;

said response speed control circuit includes:

a row command detection circuit detecting input of said row-system command, a column command detection circuit detecting input of said column-system command, a row response control circuit outputting a row response control signal in response to an output of said row command detection circuit, a column response control circuit outputting a column response control signal in response to an output of said column command detection circuit, and an output circuit activating an output of said response speed control circuit in response to said row response control signal and said column response control signal.

12. The semiconductor memory device according to claim 11, wherein said output circuit activates said output of said response speed control circuit in response to activation of at least one of said row response control signal and said column response control signal.

13. The semiconductor memory device according to claim 1, wherein said command includes a row-system command instructing control of said row-system circuit, and a column-system command instructing control of said column-system circuit;

said response speed control circuit has a row response control circuit outputting a row response control signal in response to input of said row-system command, and a column response control circuit outputting a column response control signal in response to input of said column-system command; and said current limitation part decides said operating current in response to the row and column response control signals.

* * * * *